(12) United States Patent
Kojima et al.

(10) Patent No.: US 7,037,594 B2
(45) Date of Patent: May 2, 2006

(54) ELECTROMAGNETIC WAVE SHIELDING MEMBER AND PROCESS FOR PRODUCING THE SAME

(75) Inventors: Hiroshi Kojima, Shinjuku-ku (JP); Fumihiro Arakawa, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 685 days.

(21) Appl. No.: 10/190,596

(22) Filed: Jul. 9, 2002

(65) Prior Publication Data
US 2003/0094296 A1   May 22, 2003

(30) Foreign Application Priority Data
Jul. 9, 2001   (JP)   ............................... 2001-207930
Sep. 13, 2001   (JP)   ............................... 2001-277410

(51) Int. Cl.
*B32B 15/08* (2006.01)
*B32B 15/09* (2006.01)
*B32B 15/20* (2006.01)
*H05K 9/00* (2006.01)
*C09J 175/00* (2006.01)

(52) U.S. Cl. ...................... 428/601; 428/607; 428/624; 428/626; 428/674; 428/457; 428/458; 216/56; 216/100; 156/326; 156/330.9; 156/331.7; 174/35 MS

(58) Field of Classification Search ............... 428/606, 428/607, 609, 600, 601, 624, 626, 674, 335, 428/336, 457, 458, 461; 174/35 R, 35 MS; 156/326, 325, 330.9, 331.4, 331.7, 332, 331.9; 216/83, 100, 105, 41, 56
See application file for complete search history.

(56) References Cited

U.S. PATENT DOCUMENTS 6,207,266 B1 *   3/2001   Kanbara et al. ............ 428/323

FOREIGN PATENT DOCUMENTS

JP    10-338848    12/1998

* cited by examiner

*Primary Examiner*—Michael E. Lavilla
(74) *Attorney, Agent, or Firm*—Oliff & Berridge PLC

(57) ABSTRACT

There is provided an electromagnetic wave shielding member which has see-through properties and electromagnetic wave shielding properties, is free from a change in color of an adhesive at the time of the formation of a mesh by etching, is improved in etchability, and can withstand etching at the time of the formation of the mesh. The electromagnetic wave shielding member according to the present invention comprises: a transparent film substrate; and a mesh consisting of a metal foil provided on the surface of the substrate through an adhesive, the adhesive comprising a styrene-maleic acid copolymer-modified polyesterpolyurethane and an aliphatic polyisocyanate.

20 Claims, 8 Drawing Sheets

ELECTROMAGNETIC WAVE SHIELDING MEMBER AND PROCESS FOR PRODUCING THE SAME

BACKGROUND OF THE INVENTION

1. Field of the Invention

The present invention relates to an electromagnetic wave shielding member using a mesh consisting of a thin metal film (also known as "metal foil") and a process for producing the same.

More specifically, the present invention relates to an electromagnetic wave shielding member using a mesh consisting of a thin metal film, for shielding electromagnetic waves generated from electromagnetic wave sources, such as electronic tubes of displays, which electromagnetic wave shielding member has see-through properties and electromagnetic wave shielding properties and, at the same time, is free from a change in color of an adhesive upon etching at the time of the formation of the mesh, is improved in etchability, and can withstand etching at the time of the formation of the mesh. The present invention also relates to an electromagnetic wave shielding member which can improve contrast and can realize good visibility. Further, the present invention relates to an electromagnetic wave shielding member which, according to need, can cut or absorb near-infrared radiation (light) generated from the inside of displays and can absorb specific wavelengths, i.e., the wavelengths of external light-derived visible light and/or near-infrared radiation (light) to improve contrast and can realize good visibility.

2. Prior Art

From the viewpoint of a harmful effect of electromagnetic waves on the human body, lowering the emission intensity of electromagnetic waves to values satisfying specifications has hitherto been required of electronic devices, which generate electromagnetic waves and, in use, are accessed directly by a person, for example, electronic tubes of displays, for example, plasma displays.

Further, in plasma display panels (hereinafter referred to also as "PDPs"), since plasma discharge is utilized for light emission, unnecessary electromagnetic waves in the frequency band range of 30 to 130 MHz are leaked outside the plasma display panels. For this reason, minimizing electromagnetic waves is required from the viewpoint of avoiding a harmful effect on other equipment (for example, information processing devices).

To cope with these demands, electromagnetic wave shields, wherein the outer periphery of electronic devices or the like, which generate electromagnetic waves, is covered with a suitable conductive member, are generally adopted for removing or attenuating electromagnetic waves that flow out from electronic devices, which generate electromagnetic waves, to the outside of the devices.

In display panels such as PDPs, it is common practice to provide an electromagnetic wave shielding plate having good see-through properties in front of a display.

The fundamental structure per se of electromagnetic wave shielding plates is relatively simple, and examples of conventional electromagnetic wave shielding plates include: an electromagnetic wave shielding plate wherein a thin transparent conductive film, such as a thin indium-tin oxide film (hereinafter referred to also as "ITO film"), has been formed by vapor deposition on the surface of a transparent glass or plastic substrate, sputtering or the like; an electromagnetic wave shielding plate wherein, for example, a suitable metallic screen, such as a wire mesh, has been applied to the surface of a transparent glass or plastic substrate; and an electromagnetic wave shielding plate wherein a fine mesh consisting of a thin metal film has been provided on the surface of a transparent glass or plastic substrate by forming a thin metal film on the whole surface of the substrate, for example, by electroless plating or vapor deposition and treating the thin metal film by photolithography or the like.

The electromagnetic wave shielding plate comprising an ITO film provided on a transparent substrate has excellent transparency and generally has a light transmittance of about 90%. Further, since an even film can be formed on the whole surface of the substrate, when the electromagnetic wave shielding plate is used in displays or the like, there is no fear of causing moiré or the like attributable to the electromagnetic wave shielding plate.

In the electromagnetic wave shielding plate comprising an ITO film provided on a transparent substrate, however, since a vapor deposition or sputtering technique is used for the formation of the ITO film, the production apparatus used is expensive. Further, the productivity is generally poor. This poses a problem that the price of the electromagnetic wave shielding plate per se as a product is high.

Further, the electromagnetic wave shielding plate comprising an ITO film provided on a transparent substrate has at least one order inferior electrical conductivity as compared with the electromagnetic wave shielding plate provided with a mesh consisting of a thin metal film. Therefore, this electromagnetic wave shielding plate is effective for objects which emit relatively weak electromagnetic waves, but on the other hand, when used in objects which emit strong electromagnetic waves, the shielding function is unsatisfactory posing a problem that electromagnetic waves are leaked and, in some cases, the specifications cannot be satisfied.

In the electromagnetic wave shielding plate comprising an ITO film provided on a transparent substrate, increasing the thickness of the ITO film can improve the electrical conductivity to some extent. In this case, however, disadvantageously, the transparency is remarkably deteriorated. In addition, a further increased thickness incurs a further increased product cost.

The electromagnetic wave shielding plate comprising a metallic screen applied onto the surface of a transparent glass or plastic substrate or the application of a suitable metallic screen, such as a wire mesh, directly onto the surface of a display is simple and is low in cost. This, however, suffers from a serious drawback that, since the light transmittance of a metallic screen having an effective mesh size (100 to 200 mesh) is not more than 50%, the display is very dark.

In the case of the electromagnetic wave shielding plate comprising a mesh consisting of a thin metal film provided on the surface of a transparent glass or plastic substrate, since the external form is shaped by etching according to photolithography, a fine, high open area ratio (high light transmittance) mesh can be prepared. Further, since the mesh consists of a thin metal film, the electrical conductivity is much higher than that of the ITO film or the like. This offers an advantage that strong emitted electromagnetic waves can be shielded.

This electromagnetic wave shielding plate, however, cannot absorb the reflection of external light from the display panel and has poor visibility and, in addition, suffers from an unavoidable problem that the production process is troublesome and complicate and the productivity is low resulting in high production cost.

Thus, the electromagnetic wave shielding plates have respective advantages and disadvantages, and, in use, a suitable electromagnetic wave shielding plate is selected according to applications. Among the above electromagnetic wave shielding plates, the electromagnetic wave shielding plate comprising a mesh consisting of a thin metal film provided on the surface of a transparent glass or plastic substrate has good electromagnetic wave shielding properties and light transmission properties and has recently become used for electromagnetic wave shielding purposes in such a manner that the electromagnetic wave shielding plate is placed in front of display panels such as PDPs.

In the conventional electromagnetic wave shielding plates and displays, a feature, which cuts off or absorbs near-infrared radiation (light) emitted from the inside of the display and can absorb specific wavelengths, i.e., the wavelengths of visible light emitted from the inside of the display or derived from external light for improving the contrast, is stacked by a separate step, for preventing malfunction of other equipment. Therefore, disadvantageously, the process is troublesome, the productivity is poor, and the thickness is large.

An electromagnetic wave shielding member comprising a mesh consisting of a thin metal film provided on the surface of a transparent glass or plastic substrate is shown in FIG. 4. This electromagnetic wave shielding member will be briefly described.

FIG. 4A is a plan view showing an electromagnetic wave shielding member, FIG. 4B a cross-sectional view taken on line A1–A2 of FIG. 4A, and FIG. 4C an enlarged view of a part of a mesh portion.

In FIGS. 4A and 4C, direction X and direction Y are indicated for the clarification of the positional relationship and mesh shape.

The electromagnetic wave shielding member shown in FIGS. 4A to 4C is an electromagnetic wave shielding member for an electromagnetic wave shielding plate which, in use, is placed in front of displays such as PDPs. In this electromagnetic wave shielding member, a grounding frame portion and a mesh portion are provided on one side of a transparent substrate. The grounding frame portion 415 is formed of the same thin metal film as the mesh portion and is provided around the periphery of the mesh portion 410 so as to surround the screen region of the display in using the electromagnetic wave shielding plate in such a manner that the electromagnetic wave shielding plate is placed in front of a display.

As shown in FIG. 4C (a partially enlarged view of the mesh portion 410), the mesh portion 410 comprises a group of a plurality of lines 470 provided parallel to each other at a predetermined pitch Px in direction Y and a group of a plurality of lines 450 provided parallel to each other at a predetermined pitch Py in direction X. In this connection, it should be noted that the shape of the mesh is not limited to that shown in FIG. 4.

FIG. 5A shows an example of the case where an electromagnetic wave shielding plate 500 using the electromagnetic wave shielding member shown in FIG. 4 is used in such a state that the electromagnetic wave shielding plate 500 is placed in front of PDP, and FIG. 5B an enlarged cross-sectional view of an electromagnetic wave shielding region (corresponding to portion B0) shown in FIG. 5A.

As shown in FIG. 5B, the electromagnetic wave shielding region (corresponding to portion B0) in the electromagnetic wave shielding plate 500 comprises, provided on the viewer side of a transparent glass substrate 510, an NIR layer (a near-infrared absorption layer) 530, an electromagnetic wave shielding member 400 shown in FIG. 4, and a first AR layer (an antireflection layer) film 540 in that order as viewed from the transparent glass substrate and, on the PDP 570 side of the transparent glass substrate 510, a second AR layer (an antireflection layer) film 520.

In FIG. 5, numeral 500 designates a front plate for display, numeral 400 an electromagnetic wave shielding member, numeral 410 a mesh portion, numeral 430 a transparent substrate, numeral 510 a glass substrate, numeral 520 a second AR layer film, numeral 521 a film, numeral 523 a hardcoat, numeral 525 an AR layer (an antireflection layer), numeral 527 an antifouling layer, numeral 530 an NIR layer (an near-infrared absorption layer), numeral 540 a first AR layer film, numeral 541 a film, numeral 543 a hardcoat, numeral 545 an AR layer (an antireflection layer), numeral 547 an antifouling layer, numerals 551, 553, and 555 each an adhesive layer, numeral 570 PDP (a plasma display), numeral 571 an attachment boss, numeral 573 a screw, numeral 572 a pedestal, numeral 574 a mounting bracket, numeral 575 the front part of a housing, numeral 576 the rear part of a housing, and numeral 577 a housing. The position of the NIR layer (near-infrared absorption layer) and the position of the electromagnetic wave shielding member are not particularly limited to those shown in FIG. 5B. Further, if necessary, a colored layer for color regulation may be provided.

The use of an adhesive comprising an ethylene-vinyl acetate copolymer has been proposed as a method for bonding an electromagnetic wave shielding member to a transparent substrate (Japanese Patent Laid-Open No. 307988/1999). In particular, it is known that high adhesive strength and transparency are required of the adhesive for electromagnetic wave shielding members for displays. Since, however, the adhesive is not resistant to etching at the time of the formation of a mesh, the color of the adhesive is disadvantageously changed.

SUMMARY OF THE INVENTION

It is an object of the present invention to provide an electromagnetic wave shielding member for an electromagnetic wave shielding plate, as shown in FIGS. 4A to 4C, comprising a mesh consisting of a thin metal film provided on a transparent substrate through an adhesive, which electromagnetic wave shielding member has see-through properties and electromagnetic wave shielding properties and, at the same time, is free from a change in color of an adhesive upon etching at the time of the formation of the mesh, is improved in etchability, and can withstand etching for the formation of the mesh. It is another object of the present invention to provide an electromagnetic wave shielding member having excellent visibility. It is a further object of the present invention to provide an electromagnetic wave shielding member which, in a construction comprising a minimized number of layers according to need, can cut off or absorb near-infrared radiation (light) emitted from the inside of the display and can absorb specific wavelengths, i.e., the wavelengths of visible light emitted from the inside of the display or derived from external light, for preventing the malfunction of other equipment, or for improving the contrast of images or the like on the screen of the display and for imparting good visibility.

According to one aspect of the present invention, there is provided a first electromagnetic wave shielding member comprising: a transparent film substrate; and a mesh consisting of a metal foil provided on the surface of the substrate through an adhesive, said adhesive comprising a styrene-maleic acid copolymer-modified polyesterpolyurethane and an aliphatic polyisocyanate.

According to another aspect of the present invention, there is provided a second electromagnetic wave shielding member comprising: a transparent film substrate; and a mesh consisting of a metal foil provided on the surface of the substrate through an adhesive, said adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate. The use of this adhesive can provide an electromagnetic wave shielding member which is excellent in etchability.

In a preferred embodiment of the second electromagnetic wave shielding member according to the present invention, the polyesterpolyol comprises (a) an ester of isophthalic acid with ethylene glycol and neopentyl glycol, (b) an ester of isophthalic acid with diethylene glycol, (c) an ester of isophthalic acid with ethylene glycol, neopentyl glycol, and 2,5-hexanediol, or (d) a mixture of said esters (a) to (c).

According to the present invention, there is provided a process for producing an electromagnetic wave shielding member, comprising the steps of: laminating a metal foil on the surface of a transparent film substrate with the aid of an adhesive; and etching the laminated metal foil to form a mesh, said adhesive comprising a styrene-maleic acid copolymer-modified polyesterpolyurethane and an aliphatic polyisocyanate.

In another embodiment of the process for producing an electromagnetic wave shielding member according to the present invention, the adhesive comprises (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate.

The lamination of a metal foil on a transparent film substrate followed by etching of the metal foil in the laminate member to form a mesh can provide an electromagnetic wave shielding member having good quality.

According to the present invention, there is provided a third electromagnetic wave shielding member comprising: a transparent film substrate; and a mesh consisting of a thin metal film on the surface of the substrate through an adhesive, said adhesive comprising a styrene-maleic acid copolymer-modified polyesterpolyurethane and an aliphatic polyisocyanate, said adhesive containing an absorber which can absorb specific wavelengths, i.e., the wavelengths of visible light and/or near-infrared.

According to the present invention, there is provided a fourth electromagnetic wave shielding member comprising: a transparent film substrate; and a mesh consisting of a thin metal film provided on the surface of the substrate through an adhesive, said adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate, said adhesive containing an absorber which can absorb specific wavelengths, i.e., the wavelengths of visible light and/or near-infrared.

In a preferred embodiment of the third or fourth electromagnetic wave shielding member according to the present invention, a layer for flattening the concave-convex surface of the mesh is further provided on the mesh consisting of the thin metal film, and at least one of the flattening layer and the adhesive contains an absorber which can absorb specific wavelengths, i.e., the wavelengths of visible light and/or near-infrared (see FIGS. 7 to 9).

In a further preferred embodiment, the flattening layer is provided on the mesh through a pressure-sensitive adhesive, and at least one of the flattening layer, the adhesive, and the pressure-sensitive adhesive contains an absorber which can absorb specific wavelengths, i.e., the wavelengths of visible light and/or near-infrared (see FIGS. 7 to 9).

According to the present invention, there is provided a process for producing an electromagnetic wave shielding member for an electromagnetic wave shielding plate adapted for use in such a manner that the electromagnetic wave shielding plate is placed in front of a display, or alternatively may be applied directly to the display, said electromagnetic wave shielding member having electromagnetic wave shielding properties and see-through properties and comprising a transparent film substrate and a mesh consisting of a thin metal film at least one side of which has been blackened by chromating or the like, said mesh being laminated on one side of the substrate through an adhesive comprising a styrene-maleic acid copolymer-modified polyesterpolyurethane and an aliphatic polyisocyanate, or an adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate, said process comprising the steps of: (1) a laminate member formation treatment wherein a continuous metal foil strip and a continuous film substrate strip are laminated on top of each other through the above adhesive to form a continuous laminate member strip; (2) masking treatment wherein, while carrying the laminate member in a continuous or intermittent manner, an etching-resistant resist mask, for etching the metal foil in the laminate member to form a mesh or the like, is successively formed in a continuous or intermittent manner along the longitudinal direction of the metal foil so as to cover the metal foil on its surface remote from the film substrate; and (3) etching treatment wherein the metal foil in its portions exposed from openings of the resist mask is etched to form a mesh or the like consisting of a thin metal film.

Before the lamination, both sides or one side of a copper foil or a metal foil consisting of an iron material are blackened by chromate treatment. Before the chromate treatment, copper bosses may be adhered to the copper foil.

When both sides or one side of the copper foil or the metal foil consisting of an iron material are not previously blackened by chromate treatment, after the etching in the step (3), the resist pattern is separated and removed and, if necessary, washing treatment is carried out, followed by blackening of the exposed surface of the mesh consisting of the thin metal film by chromate treatment or the like.

DETAILED DESCRIPTION OF THE INVENTION

Embodiments of the present invention will be described with reference to the accompanying drawings.

Figure 1:
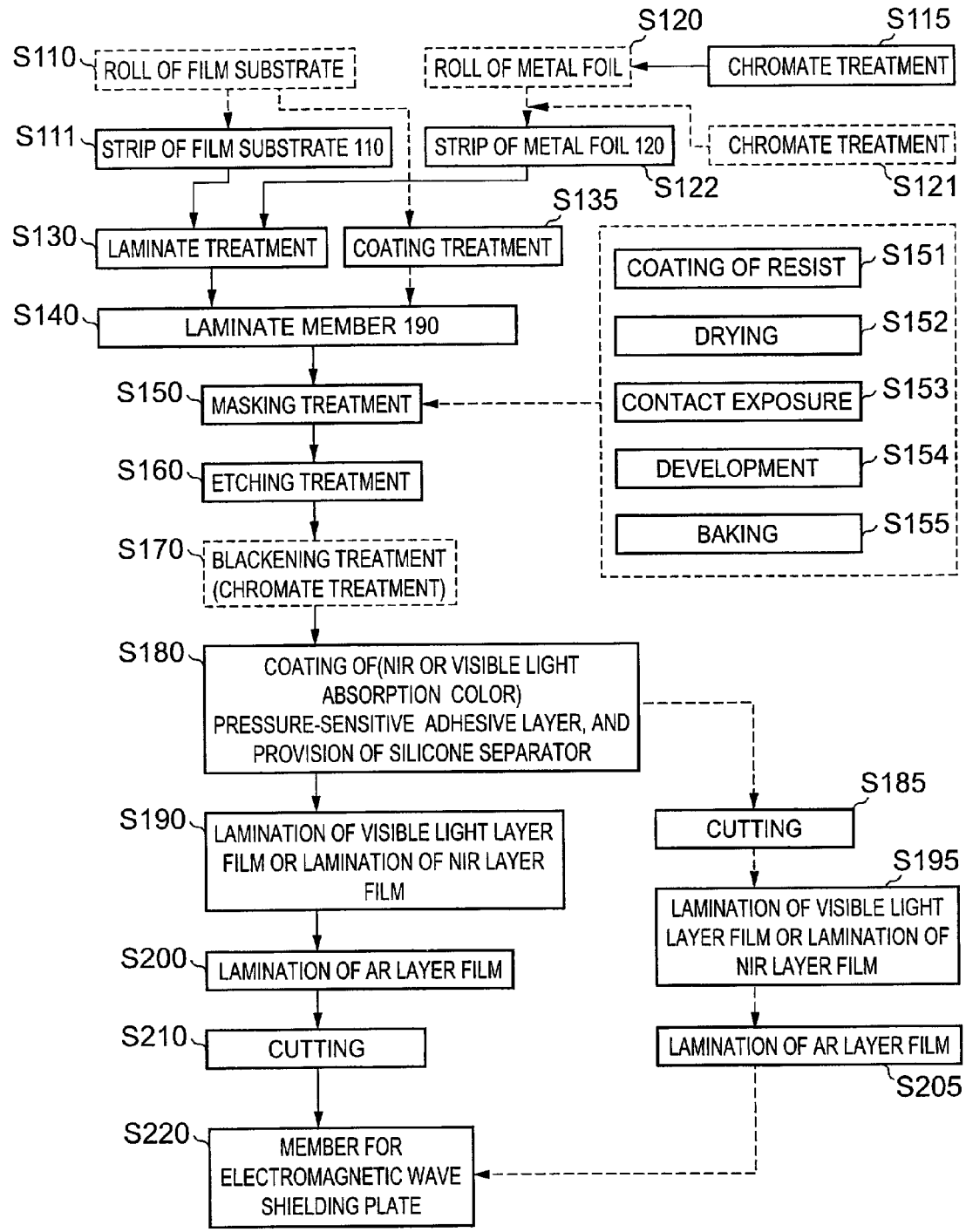
FIG. 1 is a production process flow diagram showing an embodiment of a production process of an electromagnetic wave shielding member according to the present invention.
Figure 2A:
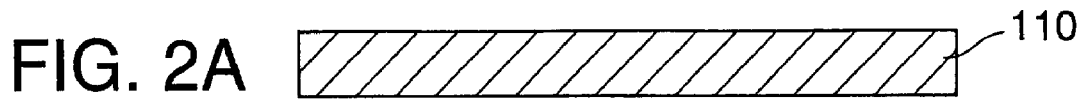
FIGS. 2A to 2G are partially sectional views illustrating masking treatment, etching treatment, and laminating treatment for laminating a silicone separator (a silicone-treated, easily separable PET film)
Figure 2B:
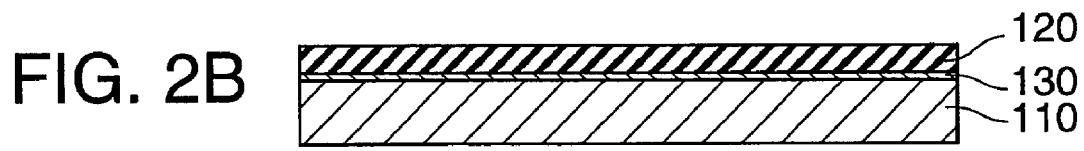
Figure 2C:
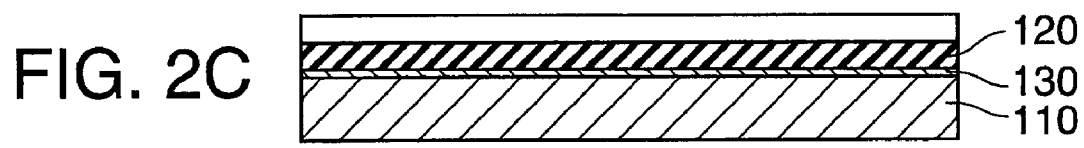
Figure 2D:
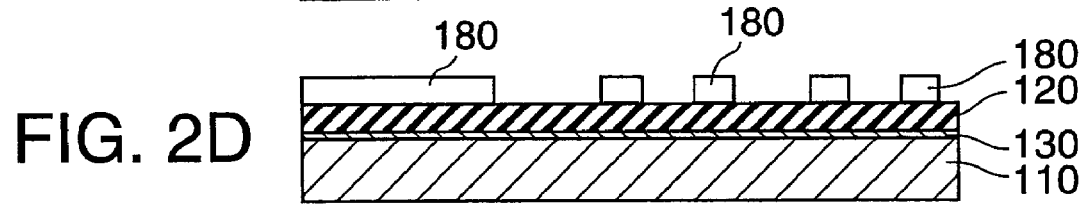
Figure 2E:
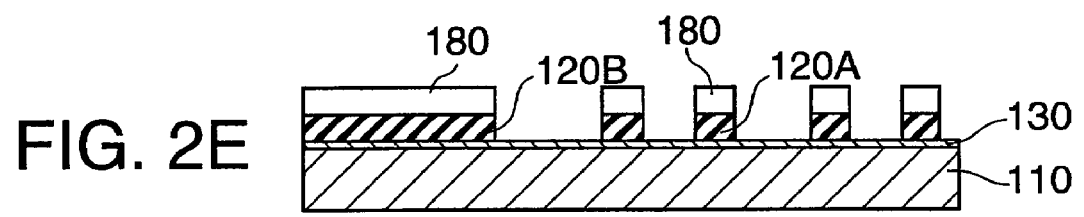
Figure 2F:
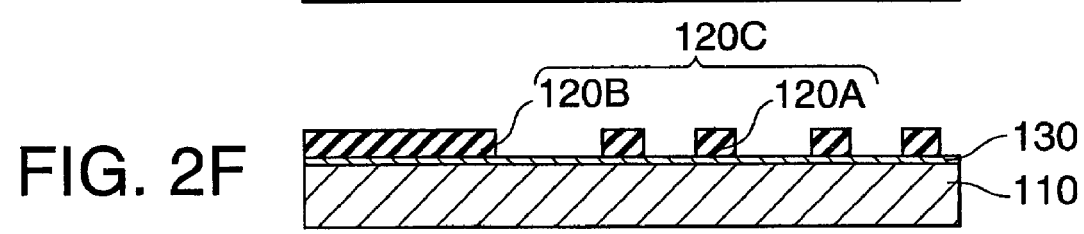
Figure 2G:
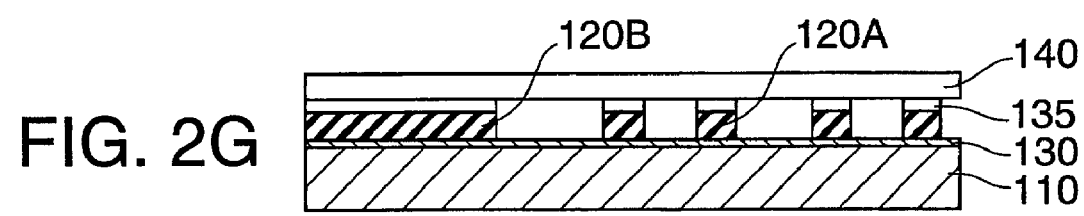
Figure 3A:
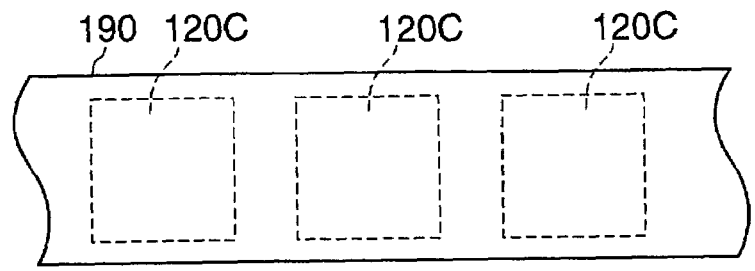
FIG. 3A is a diagram showing a positional relationship between a laminate member and a mesh portion and a grounding frame portion of an electromagnetic wave shielding member to be formed.
Figure 3B:
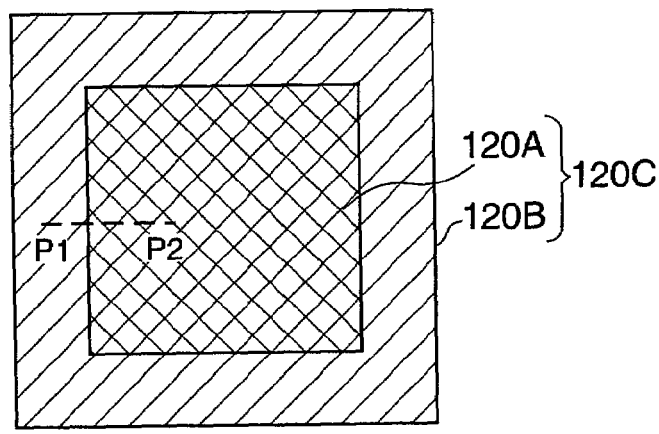
FIG. 3B is a diagram showing a mesh portion and a grounding frame portion.
Figure 3C:
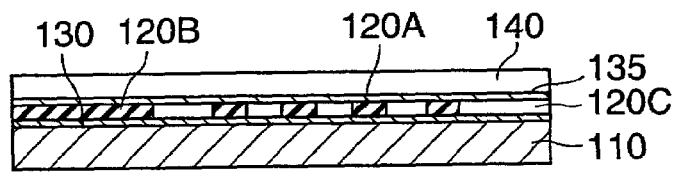
FIG. 3C is a conceptual cross-sectional view showing the layer construction of an electromagnetic wave shielding member.
Figure 3D:
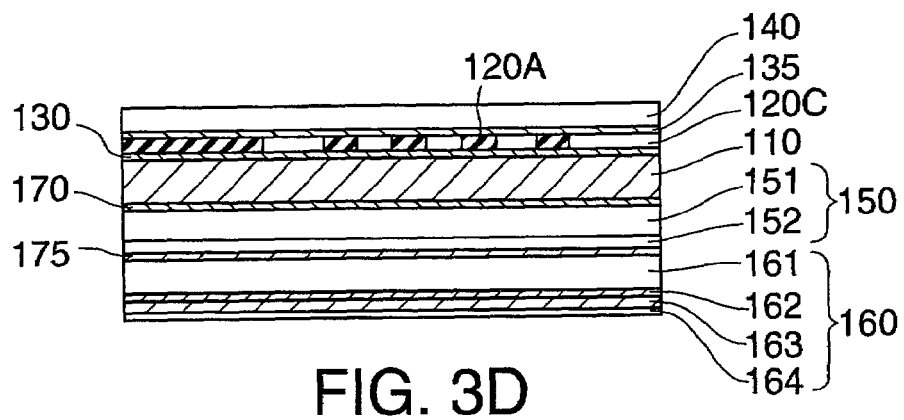
FIG. 3D is a conceptual cross-sectional view showing the layer construction of an electromagnetic wave shielding member.

FIG. 1 is a production process flow diagram showing an embodiment of a production process of an electromagnetic wave shielding member according to the present invention, FIG. 2 a partially sectional view illustrating masking treatment, etching treatment, and laminating treatment for laminating a silicone separator (a silicone-treated, easily separable PET film), FIG. 3A a diagram showing a positional relationship between a laminate member and a mesh portion and a grounding frame portion of an electromagnetic wave shielding member to be formed, FIG. 3B a diagram showing a mesh portion and a grounding frame portion, and FIGS. 3C and 3D cross-sectional views showing the layer construction of an electromagnetic wave shielding member. FIGS. 2A to 2G and FIGS. 3C and 3D are cross-sectional views of position P1–P2 shown in FIG. 3B.

In FIGS. 1, 2, and 3, numeral 110 designates a film substrate, numeral 120 a metal foil, numeral 120A a mesh portion, numeral 120B a grounding frame portion, numeral 120C a treated portion, numeral 130 an adhesive layer, numeral 135 a pressure-sensitive adhesive layer, numeral 140 a silicone separator (a protective film), numeral 150 an NIR layer film, numeral 151 a film, numeral 152 an NIR layer, numeral 160 an AR layer film, numeral 161 a film, numeral 162 a hardcoat, numeral 163 an antireflection layer, numeral 164 an antifouling layer, numerals 170 and 175 each an adhesive layer, and numeral 190 a laminate member. In FIG. 1, S110 to S220 represent treatment steps.

Figure 6A:
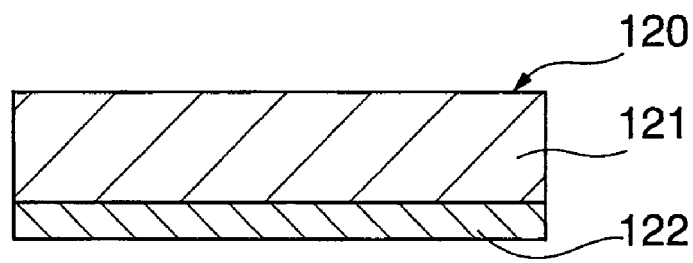
FIG. 6A is a cross-sectional view showing an embodiment of the layer construction of a metal foil 120 shown in FIG. 2.
Figure 6B:
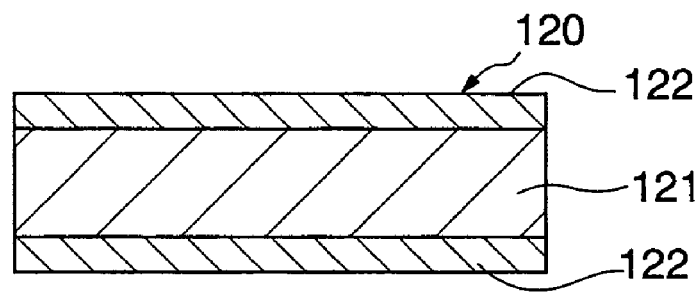
FIG. 6B is a cross-sectional view showing another embodiment of the layer construction of the metal foil 120 shown in FIG. 2.

FIGS. 6A and 6B are cross-sectional views showing two embodiments of the layer construction of a metal foil 120 shown in FIG. 2. Specifically, FIG. 6A is a cross-sectional view showing a metal foil 120 wherein a chromate layer (a blackened layer) 122 is provided on one side of a metal layer 121, and FIG. 6B a cross-sectional view showing a metal foil 120 wherein a chromate layer (a blackened layer) 122 is provided on both sides of a metal layer 121.

At the outset, a first embodiment of the production process of an electromagnetic wave shielding member according to the present invention will be described with reference to FIG. 1.

Figure 5A:
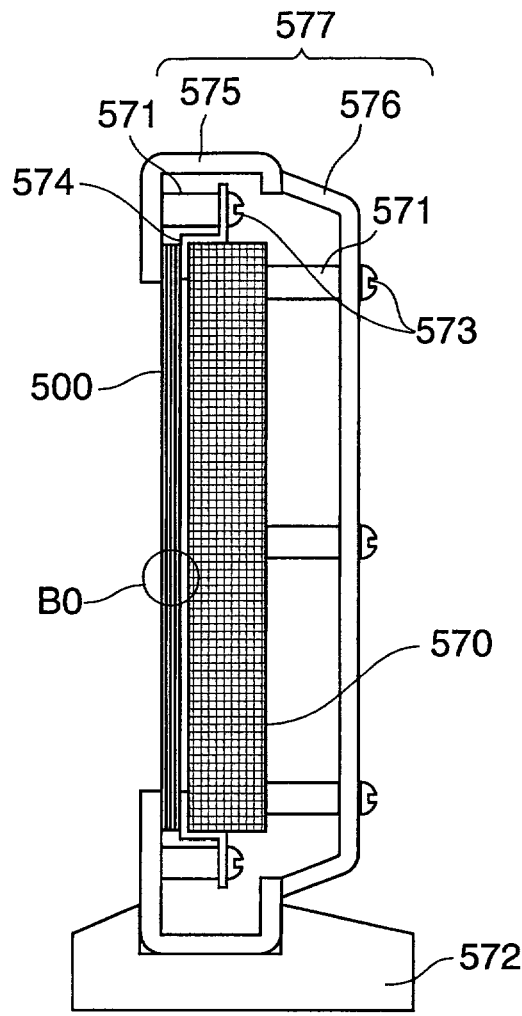
FIG. 5A is an embodiment of the use of an electromagnetic wave shielding plate using the electromagnetic wave shielding member shown in FIG. 4 wherein the electromagnetic wave shielding plate is placed in front of PDP.
Figure 5B:
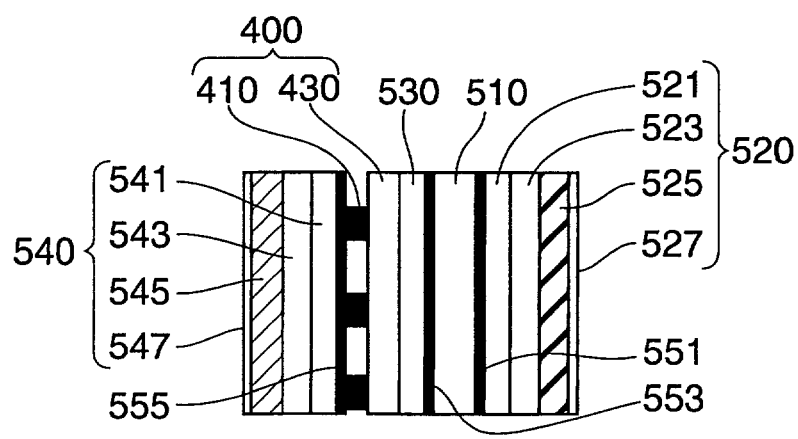
FIG. 5B is an enlarged cross-sectional view showing an electromagnetic wave shielding region (corresponding to portion B0) shown in FIG. 5A.

The production process according to this embodiment aims to mass produce an electromagnetic wave shielding member, shown in FIGS. 5A and 5B, for use in the preparation of an electromagnetic wave shielding plate used in such a manner that the electromagnetic wave shielding plate is placed in front of displays such as PDP. The electromagnetic wave shielding member has electromagnetic wave shielding properties and see-through properties and comprises a transparent film substrate and, provided on one side of the substrate, a mesh consisting of a thin metal film at least one side of which has been blackened by chromate treatment, said mesh being laminated on one side of the substrate. In this case, a 1 to 100 µm-thick copper foil or an iron material (low carbon steel) is used as a metal foil for the formation of the mesh consisting of a thin metal foil.

At the outset, a continuous film substrate wound into a roll form is provided (S110) and is brought to a stretched state without loosening (S111), and a continuous (chromated) metal foil wound into a roll form is provided (S120) and is brought to a stretched state without loosening (S122). A continuous metal foil 120 strip is laminated (S130) onto one side of the continuous film substrate 110 strip through an adhesive comprising a styrene-maleic acid copolymer-modified polyesterpolyurethane and an aliphatic polyisocyanate, or an adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate, to form a continuous laminate member 190 in a strip form wherein the film substrate 110 and the metal foil 120 have been laminated on top of each other (S140). The lamination can be carried out by means of a laminate roll comprising a pair of rolls.

According to a more preferred embodiment, the transparent film substrate is polyethylene terephthalate, and the metal foil has a thickness of 5 to 20 µm. When the thickness of the metal foil is 5 to 20 µm, a mesh having a fine pattern can be prepared. When the thickness of the metal foil is not more than 5 µm, the formation of the fine pattern becomes easy. In this case, however, the electric resistance value of the metal is increased, and the electromagnetic wave shielding effect is deteriorated. On the other hand, when the thickness is not less than 20 µm, it is difficult to form the mesh having a fine pattern. Further, in this case, since the open area ratio is substantially lowered, the light transmittance is lowered and, in addition, the angle of view is narrowed. That is, when the thickness of the metal foil is 5 to 20 µm, an electromagnetic wave shielding member having excellent visibility can be provided.

In the electromagnetic wave shielding member according to the present invention, the mesh consisting of a thin metal film is not always required to be blackened by chromate treatment. However, the use of a mesh consisting of a thin metal film, at least one side of which has been blackened by chromate treatment, is preferred.

In the electromagnetic wave shielding member according to the present invention, preferably, the metal foil is a copper foil, at least one side of the copper foil has been roughened by cathodically electrodepositing copper bosses, and at least one side of the metal foil has been chromated. This can provide an electromagnetic wave shielding member having excellent visibility (see FIGS. 11 and 12). When the metal foil is a copper foil, copper bosses can be cathodically electrodeposited. Here the purpose and method of the deposition of copper bosses by cathodic electrodeposition will be described in detail. In order to improve the visibility, preferably, the mesh pattern in its observer's side is blackened and roughened. This can improve the contrast. The blackening/roughening treatment is carried out by cathodically electrolyzing the copper foil in an electrolysis solution comprising sulfuric acid and copper sulfate to deposit cationic copper particles. When the metal foil is a copper foil, copper bosses can be cathodically electrodeposited. This can provide such black that could not have hitherto been realized and can improve the contrast of the display. Further, rust preventive chromate treatment (hereinafter often referred to simply as "chromate treatment") can improve handleability and can prevent a deterioration in quality caused by rust.

Figure 11:
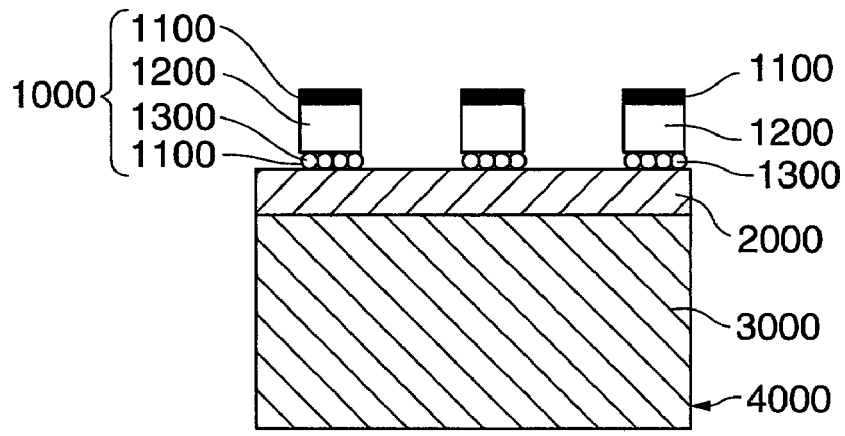
FIG. 11 is a cross-sectional view showing an embodiment of the layer construction of a vertical section obtained by cutting an electromagnetic wave shielding member 4000 shown in FIG. 10 in its plane parallel to a mesh of a copper foil 1000 (Example 1)

More preferably, the metal foil on its surface with copper bosses being cathodically electrodeposited thereon has been adhered to the film substrate (see FIG. 11).

Figure 7:
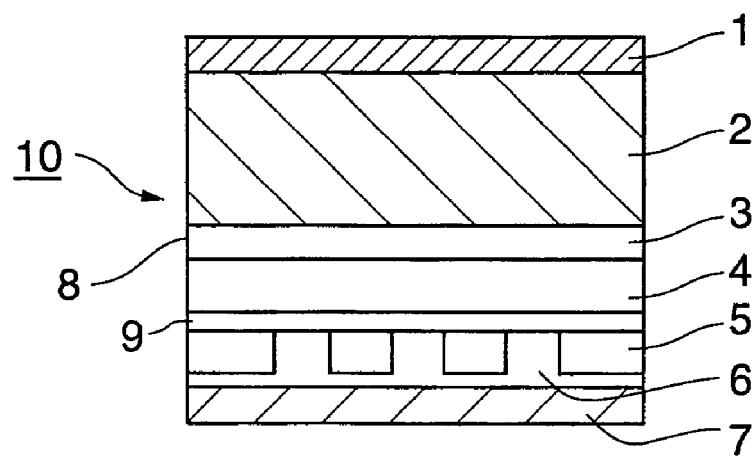
FIG. 7 is a cross-sectional view showing an embodiment of the layer construction of the electromagnetic wave shielding member according to the present invention.
Figure 8:
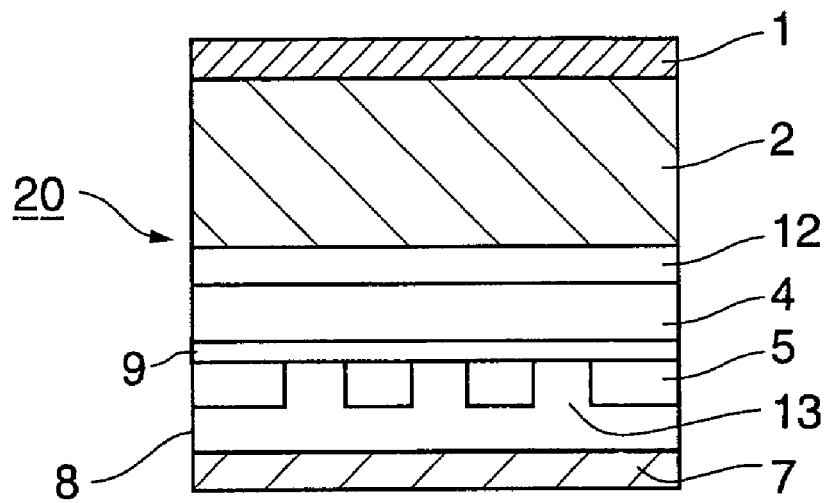
FIG. 8 is a cross-sectional view showing another embodiment of the layer construction of the electromagnetic wave shielding member according to the present invention.
Figure 9:
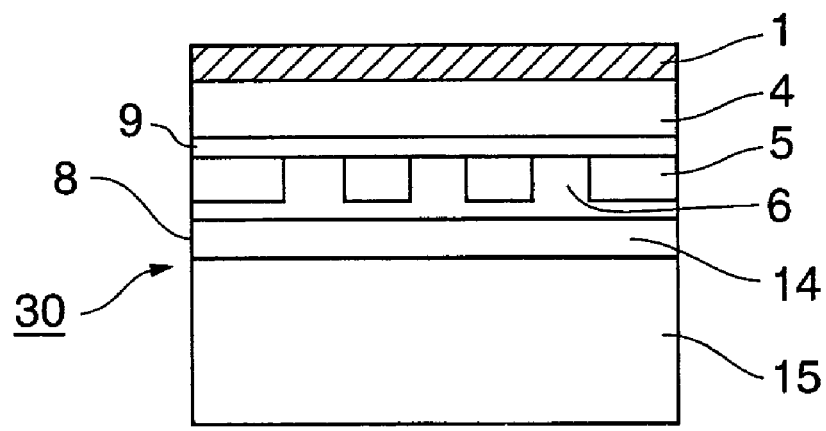
FIG. 9 is a typical cross-sectional view showing an embodiment of a display onto which the electromagnetic wave shielding member according to the present invention has been laminated.
Figure 10:
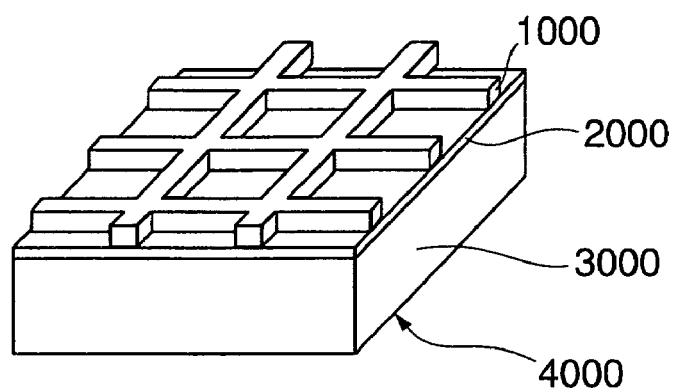
FIG. 10 is a perspective view showing an embodiment of the layer construction of the electromagnetic wave shielding member according to the present invention (Example 1)

Further, in the electromagnetic wave shielding member according to the present invention, a visible light absorption layer and/or a near-infrared absorption layer may be provided. An antireflection layer and/or an antiglare layer (1, 7) may also be provided in the electromagnetic wave shielding member. A glass or acrylic transparent substrate 2 may also be provided in the electromagnetic wave shielding member (FIGS. 7 to 9). The electromagnetic wave shielding member may be provided directly on the surface of a display 15 (FIG. 9).

According to a preferred embodiment, in the electromagnetic wave shielding member, a mesh consisting of a thin metal film, at least one side of which has been blackened, for example, by chromate treatment or by a metal oxide or a metal sulfide, is provided on the surface of a transparent film substrate through an adhesive comprising a styrene-maleic acid copolymer-modified polyesterpolyurethane and an aliphatic polyisocyanate, or an adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate. The electromagnetic wave shielding member having the above construction has a combination of electromagnetic wave shielding properties with see-through properties. Further, chromate treatment for surface blackening for absorbing external light can provide a blackened layer which has high black density and high adhesion to a metal.

More preferably, the black density of the chromated surface of the mesh consisting of the thin metal film is not less than 0.6. In this case, external light can be absorbed, and, thus, good visibility can be realized. Here all the measurements of black density in the present invention were carried out with GRETAG SPM 100-11 of COLOR CONTROL SYSTEM manufactured by KIMOTO under conditions of observation field of view=10 degrees and observation light source=D50. In this case, illumination type was set to density standard ANSI T, and each sample was measured after white calibration. The production process of an electromagnetic wave shielding member according to the present invention will be described mainly with reference to the case where the blackening has been carried out by chromate treatment.

When the surface roughness of the metal foil is not more than 0.5 µm in terms of ten-point mean roughness Rz specified in JIS B 0601, the external light is subjected to mirror reflection which deteriorates visibility, even in the case where the surface has been blackened. On the other hand, when the ten-point mean roughness Rz specified in JIS B 0601 is not less than 10 µm, it is difficult to coat an adhesive, a resist or the like onto the metal foil. The surface roughness of the (electrolytic) metal foil can be achieved by regulating the surface roughness of the metallic roll in the production of the material.

The metal constituting the metal foil is not particularly limited, and examples thereof include copper, iron, nickel, and chromium. Among them, copper is most preferred from the viewpoints of the deposition of copper bosses by cathodic electrodeposition, shielding properties of electromagnetic waves, suitability for etching, and handleability.

The copper foil may be a rolled copper foil or an electrolytic copper foil. The electrolytic copper foil is particularly preferred because a thickness of not more than 10 µm can be realized, the thickness is even, and the adhesion to the chromate film is good. Preferably, before the chromate treatment, copper bosses are adhered to the copper foil.

When the metal foil is an iron material (low-carbon steel, Ni—Fe alloy), an electromagnetic wave shielding member, which is particularly excellent in electromagnetic wave shielding properties, can be prepared.

The iron material is preferably substantially Ni-free low-carbon steel, such as low-carbon rimmed steel or low-carbon aluminum killed steel, from the viewpoint of etching treatment. However, the iron material is not limited to these steels only.

When the metal foil is thick, the formation of a high-definition pattern having a small line width is difficult due to side etching. On the other hand, when the metal foil is thin, satisfactory electromagnetic wave shielding effect cannot be attained. For this reason, the thickness of the metal foil is preferably 1 to 100 μm, particularly preferably 5 to 20 μm.

According to the present invention, there is provided a process for producing an electromagnetic wave shielding member for an electromagnetic wave shielding plate adapted for use in such a manner that the electromagnetic wave shielding plate is placed in front of a display, or alternatively may be applied directly to the display, said electromagnetic wave shielding member having electromagnetic wave shielding properties and see-through properties and comprising a transparent film substrate and a mesh consisting of a thin metal film at least one side of which has been blackened by chromate treatment or the like, said mesh being laminated on one side of the substrate through an adhesive comprising a styrene-maleic acid copolymer-modified polyesterpolyurethane and an aliphatic polyisocyanate, or an adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate, said process comprising the steps of: (1) a laminate member formation treatment (hereinafter referred to also as "lamination treatment") wherein a continuous metal foil strip and a continuous film substrate strip are laminated on top of each other through the above adhesive to form a continuous laminate member strip; (2) masking treatment wherein, while carrying the laminate member in a continuous or intermittent manner, an etching-resistant resist mask, for etching the metal foil in the laminate member to form a mesh or the like, is successively formed in a continuous or intermittent manner along the longitudinal direction of the metal foil so as to cover the metal foil on its surface remote from the film substrate; and (3) etching treatment wherein the metal foil in its portions exposed from openings of the resist mask is etched to form a mesh or the like consisting of a thin metal film.

Before the lamination, both sides or one side of a copper foil or a metal foil consisting of an iron material are blackened by chromate treatment. Before the chromate treatment, copper bosses may be adhered to the copper foil.

When both sides or one side of the copper foil or the metal foil consisting of an iron material are not previously blackened by chromate treatment, after the etching in the step (3), the resist pattern is separated and removed and, if necessary, washing treatment is carried out, followed by blackening of the exposed surface of the mesh consisting of the thin metal film by chromate treatment or the like.

In the step (3), after the etching treatment, if necessary, lamination treatment is carried out wherein an adhesive layer or a pressure-sensitive adhesive layer containing an absorber capable of absorbing specific wavelengths, i.e., the wavelengths of visible light and/or near-infrared is provided on the surface of the mesh consisting of the thin metal film, and a silicone separator (a silicone-treated, easily separable PET film) is laminated thereon. Further, the laminate member formation treatment in the step (1) is lamination treatment wherein a continuous metal foil strip is laminated onto the surface of a continuous film substrate strip through the above adhesive to form a laminate member in the form of a continuous strip of a laminate of a metal foil and a film substrate. Polyester, polyethylene and the like may be mentioned as the film substrate 110 which requires the use of an adhesive or the like in the lamination treatment. On the other hand, ethylene-vinyl acetate resin, ethylene-acrylic acid resin, ethylene-ethyl acrylate resin, and ionomer resin may be mentioned as the film substrate 110 which does not always require the use of an adhesive in the lamination treatment.

In the step (1), the lamination member formation treatment may be carried out by coating a resin onto one side of a continuous metal foil strip by a coating method such as extrusion coating or hot melt coating.

Resins usable in the extrusion coating include polyolefins and polyesters.

Resins usable in the hot melt coating include resins composed mainly of ethylene-vinyl acetate resin, resins composed mainly of polyesters, and resins composed mainly of polyamides.

The masking treatment in the step (2) is preferably carried out by coating a resist onto the surface of a metal foil, drying the coating, then subjecting the resist to contact exposure using a predetermined pattern plate, performing development treatment to form a predetermined resist pattern on the surface of the metal foil, and optionally baking the resist pattern.

When the etching treatment of the metal foil is carried out using a ferric chloride solution as an etching solution, the etching solution can be easily circulated and reutilized and this can easily realize continuous etching treatment in a continuous through line.

When the iron material is a Ni—Fe (nickel-iron) alloy such as an Invar material (42% Ni—Fe alloy), the etching solution is contaminated with nickel. Therefore, to cope with this, the etching solution should be properly controlled.

In the above embodiment, a method may also be adopted wherein a feature not imparted to the pressure-sensitive color layer is stacked on a separate film and this laminate is then stacked. For example, the step of lamination may be provided wherein, after the lamination treatment wherein a silicone separator (a silicone-treated, easily separable PET film) is laminated, an NIR layer (a near-infrared absorption layer) film comprising an NIR layer provided on one side of a film and an AR layer (an antireflection layer) film comprising an AR layer provided on one side of a film are laminated in that order onto the surface of the transparent film substrate remote from the mesh. In the step of lamination, the NIR layer film is laminated through an adhesive layer onto the surface of the transparent film substrate remote from the mesh, and the AR layer film is then laminated through an adhesive layer onto the NIR layer film. At least one of the adhesive and the pressure-sensitive adhesive contains an absorber which can absorb specific wavelengths, i.e., the wavelengths of visible light and/or near-infrared.

By virtue of the above construction, the production process of an electromagnetic wave shielding member according to the present invention can produce an electromagnetic wave shielding member provided with a mesh consisting of a thin metal film, adapted for use in an electromagnetic wave shielding plate, which electromagnetic wave shielding member has a capability of absorbing specific wavelengths, i.e., the wavelengths of visible light and/or near-infrared and good visibility, has satisfactory quality, and can be produced with good productivity.

Figure 4A:
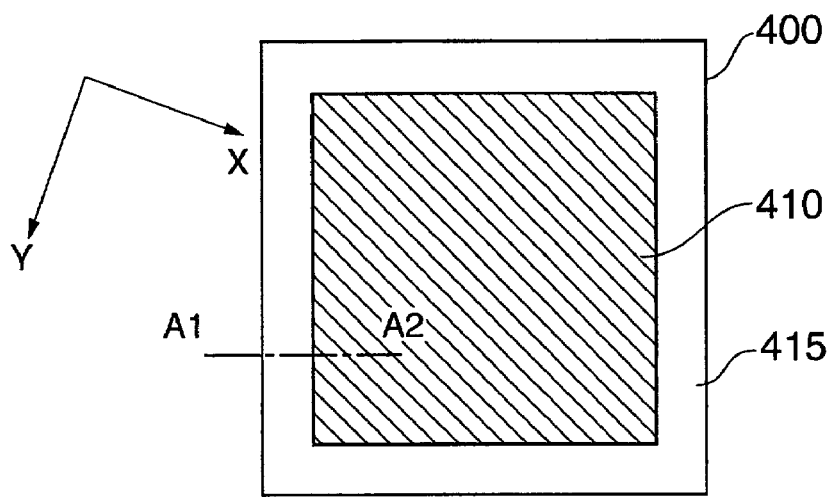
FIG. 4A is a plan view of an electromagnetic wave shielding member.
Figure 4B:
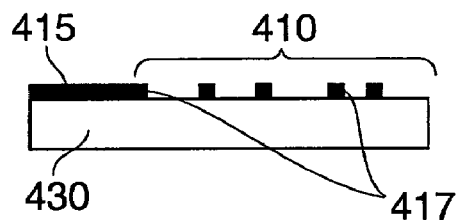
FIG. 4B is a cross-sectional view taken on line A1-A2 of FIG. 4A.
Figure 4C:
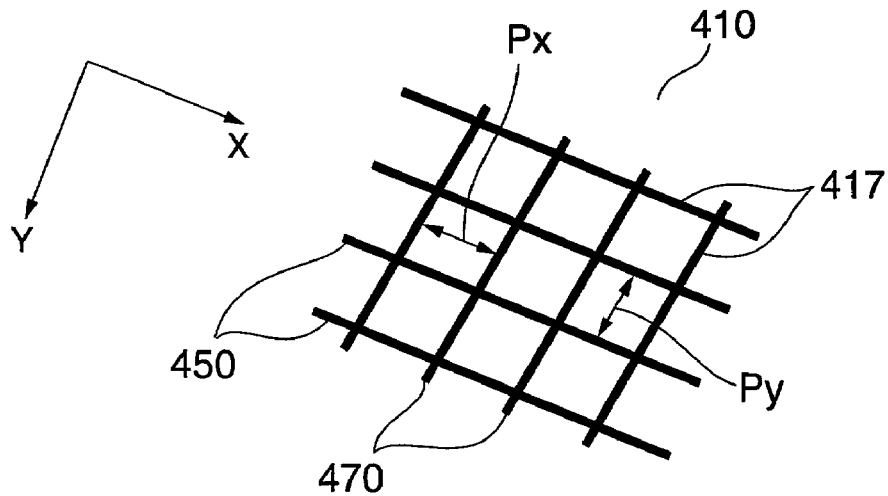
FIG. 4C is an enlarged view of a part of a mesh portion.

This can realize the mass production of an electromagnetic wave shielding plate for a display such as PDP, as shown in FIG. 4 or the like, which has a capability of absorbing specific wavelengths, i.e., the wavelengths of visible light and/or near-infrared and good visibility, see-through properties, and electromagnetic wave shielding properties, in a high productivity rate.

In another embodiment, the production process comprises the steps of: (1) laminate member formation treatment wherein a continuous chromated metal foil strip and a continuous film substrate strip are put on top of each other through an adhesive comprising a styrene-maleic acid copolymer-modified polyesterpolyurethane and an aliphatic polyisocyanate, or an adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate, to form a continuous laminate member strip; (2) masking treatment wherein, while carrying the laminate member in a continuous or intermittent manner, an etching-resistant resist mask, for etching the metal foil in the laminate member to form a mesh or the like, is successively formed in a continuous or intermittent manner along the longitudinal direction of the metal foil so as to cover the metal foil on its surface remote from the film substrate; (3) etching treatment wherein the metal foil in its portions exposed from openings of the resist mask is etched to form a mesh or the like consisting of a thin metal film; and lamination treatment wherein, after the etching treatment, a pressure-sensitive adhesive layer or a flattening layer containing an absorber capable of absorbing specific wavelengths, i.e., the wavelengths of visible light and/or near-infrared is optionally provided on the surface of the mesh consisting of a thin metal film, and a silicone separator (a silicone-treated, easily separable PET film) is laminated. According to this construction, as with the preparation of a shadow mask, for a cathode-ray tube for color TV, from a continuous strip of a steel product, masking treatment and etching treatment can be carried out in a continuous through line.

When the laminate member formation treatment is lamination treatment wherein a continuous metal foil strip is laminated onto the surface of a continuous film substrate strip through an adhesive comprising a styrene-maleic acid copolymer-modified polyesterpolyurethane and an aliphatic polyisocyanate, or an adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate, to form a laminate member in a continuous strip form of a laminate of the metal foil and the film substrate, the operation is simple and the metal foil can be continuously etched with good productivity. In particular, when the masking treatment is carried out by coating a resist on the surface of a metal foil, drying the coating, then subjecting the resist to contact exposure using a predetermined pattern plate, performing development treatment to form a predetermined resist pattern on the surface of the metal foil, and optionally baking the resist pattern, advantages can be offered including the realization of high-definition plate making using a resist, satisfactory quality, and mass production.

In the present invention, prior to the laminate member formation treatment, when both sides or one side of a copper foil or a metal foil consisting of an iron material or the like are blackened by chromate treatment, the reflection of light from the blackened surface of the metal foil can be prevented. Before the chromate treatment, preferably, copper bosses are deposited on the copper foil.

In particular, before the laminate member formation treatment, when both sides or one side of the metal foil are blackened by chromate treatment, the need to perform blackening treatment by chromate treatment in a later state can be eliminated and, consequently, the working efficiency can be improved.

When both sides or one side of the copper foil or the metal foil consisting of an iron material are not previously blackened by chromate treatment, a method is used wherein, after the etching treatment, the resist pattern is separated and removed and, if necessary, washing treatment is carried out, followed by blackening of the exposed surface of the mesh consisting of the thin metal film by chromate treatment. In this case, however, the working efficiency is poor.

More preferably, not only the viewer side but also the display side is chromated because the stray of light from the display can be prevented.

The chromate treatment refers to coating of a chromating liquid onto a material to be treated. The chromating liquid may be coated, for example, by roll coating, air curtain coating, electrostatic spray coating, squeeze roll coating, or dip coating. In this case, the coating is dried without washing with water.

In the present invention, the material to be treated is a mesh consisting of the above-described metal foil or thin metal film. An aqueous solution containing 3 g/liter of $CrO_2$ is generally used as the chromating liquid. "A chromating liquid prepared by adding, to an aqueous chromic anhydride solution, a different oxycarboxylic acid compound to reduce a part of chromium(VI) to chromium(III)" may also be used. Specific examples of chromate treatment methods include a method wherein one side or the whole of the metal foil is dipped in an aqueous solution (25° C.) containing 3 g/liter of $CrO_2$ for 3 sec, and a method which comprises the steps of: adding, to an aqueous chromic anhydride solution, a different oxycarboxylic acid compound to reduce a part of chromium(VI) to chromium(III); roll coating the resultant chromating liquid onto a metal foil; and drying the coating at 120° C.

Oxycarboxylic acid compounds include tartaric acid, malonic acid, citric acid, lactic acid, glucolic acid, glyceric acid, tropic acid, benzilic acid, and hydroxyvaleric acid. These reducing agents may be used alone or in a combination of two or more. The reduction capability varies depending upon compounds. Therefore, the amount of the reducing agent added is determined by grasping a reduction to chromium(III). When the transparent film substrate is a PET film (polyethylene terephthalate film), each treatment can be successfully carried out without causing chemical attack.

The provision of the step of laminating, after the lamination of the silicone separator (silicone-treated, easily separable PET film), an NIR layer (a near-infrared absorption layer) film comprising an NIR layer provided on one side of a film and an AR layer (an antireflection layer) film comprising an AR layer provided on one side of a film in that order onto the surface of the transparent film substrate remote from the mesh, can realize the preparation of an electromagnetic wave shielding member (a front protection plate for displays) which has electromagnetic wave shielding function and, in addition, near-infrared absorption function and antireflection function. Further electromagnetic wave shielding members (front protection plates for displays) include those having a layer construction shown in FIGS. 7 and 8.

As shown in FIGS. 3C and 3D, when the pressure-sensitive adhesive layer 135 or adhesive layer in the opening of the mesh consisting of a thin metal film functions as a flattening layer, no problem occurs. In general, however, as shown in FIG. 2G, the concaves and convexes in the surface of the thin metal film (foil) provides a rough surface which deteriorates transparency. Further, the concaves and convexes in the mesh consisting of the thin metal film makes it difficult to laminate the assembly onto a front panel of glass or the like, an antireflection layer, a display or the like. To overcome this drawback, preferably, before the formation of the pressure-sensitive adhesive layer or the adhesive layer, a resin is coated onto the assembly in its side of the mesh consisting of the thin metal film to form a flattening resin layer 6 (see FIGS. 7 to 9). In coating the resin, care should be taken so as not to leave air bubbles at the corner of the mesh consisting of the thin metal film and to deteriorate the transparency. Preferred coating methods for avoiding this unfavorable phenomenon include a method wherein a coating material having low viscosity using a solvent or the like is coated and the coating is then dried, and a method wherein a resin is laminated while removing air.

Preferred resins usable for the flattening include those which have high transparency and good adhesion to a dry lamination adhesive and a copper mesh, and, when the flattening resin layer contains an absorber capable of absorbing specific wavelengths, i.e., the wavelengths of visible light and/or near-infrared, further has excellent dispersion in each dispersant. The surface of the flattening resin layer is particularly important from the viewpoint of preventing moiré and uneven interference in displays, and minimizing protrusions, dents, lack of uniformity and the like is preferred. For example, a resin layer having a high level of flatness can be formed by coating or applying a resin, laminating a substrate or the like having a high level of flatness onto the coating, then exposing the coating to heat or light to cure the resin, and separating the substrate. The resin is not particularly limited so far as the above property requirements are satisfied. However, acrylic ultraviolet-curable resins are preferred from the viewpoints of coatability, hardcoat properties, easiness in flattening and the like. Imparting pressure-sensitive adhesive properties or adhesive properties to the resin can realize the formation of a pressure-sensitive adhesive layer or an adhesive layer having a high level of flatness which can reduce the number of layers or the number of production steps.

In this embodiment, the metal foil 120 is a copper foil or an iron material (a low-carbon steel substantially free from nickel), and, before lamination, blackening treatment is carried out by chromate treatment (S115 or S121) to blacken both sides of the metal foil and, consequently, to form a chromate layer 122 (see FIG. 6B and FIG. 1).

Here the chromation before the lamination means that a continuous metal foil generally wound into a roll is supplied (S120) and is previously chromated offline (S115). When the continuous metal foil, which is supplied in a roll wound form (S120), is not previously chromated offline (S115), a method may be used wherein, in the step before the step of lamination, the metal foil is chromated inline (S121).

The blackening treatment was carried out by chromate treatment. In this case, a method was used wherein the metal foil 120 was dipped in an aqueous solution (25° C.) containing 3 g/liter of $CrO_2$ for 3 sec.

The film substrate 110 is not particularly limited so far as the film substrate is highly transparent, can withstand the treatment, and is highly stable. In general, however, a PET film is used. A biaxially stretched PET film has good transparency, chemical resistance, and heat resistance and thus is particularly preferred.

As described above, polyester, polyethylene and the like may be mentioned as the film substrate 110 which requires the use of an adhesive or a pressure-sensitive adhesive in the step of lamination treatment (S130). On the other hand, ethylene-vinyl acetate resin, ethylene-acrylic acid resin, ethylene-ethyl acrylate resin, and ionomer resin may be mentioned as the film substrate 110 which does not always require the use of an adhesive in the step of lamination treatment (S130).

In the present invention, an adhesive, comprising a styrene-maleic acid copolymer-modified polyesterpolyurethane and an aliphatic polyisocyanate, which is not stained by or deteriorated by the etching solution, is used as the adhesive provided between the transparent film substrate and the mesh consisting of a thin metal film.

In another embodiment, the adhesive comprises (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate. Examples of preferred adhesives usable other than the above adhesives include adhesives of acrylic resins, polyester resin, polyurethane resin, polyvinyl alcohol or partially saponified product of polyvinyl alcohol (tradename: Poval), vinyl chloride-vinyl acetate copolymer, ethylene-vinyl acetate copolymer, and, from the viewpoints of no significant dyeing with and deterioration by the etching solution, post treatment, lamination, coatability and the like, heat-curable resins and ultraviolet-curable resins.

Polyester resins are also preferred particularly from the viewpoints of adhesion to transparent polymeric substrates, compatibility with and dispersion in the above-described visible light absorbers and infrared absorbers (hereinafter referred to also as "near-infrared absorbers") and the like.

In order to impart the capability of absorbing visible light and/or near-infrared, an absorber (a visible light absorber or a near-infrared absorber), which can absorb specific wavelengths, i.e., the wavelengths of visible light and/or near-infrared, is optionally mixed and dispersed in the adhesive.

The adhesive layer may be coated to a thickness of 1 to 100 μm onto a film substrate by various coating methods such as roll coating, Mayer bar coating, or gravure coating.

Pressure-sensitive adhesives include, for example, natural rubber, synthetic rubber, acrylic resin, polyvinyl ether, urethane resin, and silicone resin pressure-sensitive adhesives. Specific examples of synthetic rubber pressure-sensitive adhesives include styrene-butadiene rubber (SBR), acrylonitrile-butadiene rubber (NBR), polyisobutylene rubber, isobutylene-isoprene rubber, isoprene rubber, styrene-isoprene block copolymer, styrene-butadiene block copolymer, and styene-ethylene-butylene block copolymer.

Specific examples of silicone resin pressure-sensitive adhesives include dimethylpolysiloxane. These pressure-sensitive adhesives may be used alone or in a combination of two or more.

In order to impart the capability of absorbing visible light and/or near-infrared, an absorber (a visible light absorber or a near-infrared absorber), which can absorb specific wavelengths, i.e., the wavelengths of visible light and/or near-infrared, is optionally mixed and dispersed in the pressure-sensitive adhesive. Further, if necessary, tackifiers, fillers, softeners, antioxidants, ultraviolet absorbers, crosslinking agents and the like are mixed and dispersed in the pressure-sensitive adhesive.

The pressure-sensitive adhesive layer may be formed to a thickness of 1 to 100 µm, preferably 10 to 50 µm, onto a film substrate by various coating methods such as roll coating, Mayer bar coating, or gravure coating. Next, masking treatment (S150) and etching treatment (S160) are carried out. In the masking treatment (S150), while carrying the laminate member 190 in a continuous or intermittent manner, in such a state that the laminate member 190 is stretched without loosening, an etching-resistant resist mask, for etching the metal foil in the laminate member to form a mesh or the like, is successively formed in a continuous or intermittent manner along the longitudinal direction of the metal foil. In the etching treatment (S160), the metal foil in its portions exposed from the resist mask is etched to form a mesh or the like consisting of a thin metal film.

As shown in FIG. 3A, etched portions 120C of a mesh or the like are provided at predetermined intervals in the metal foil in the longitudinal direction of the laminate member 190. In this embodiment, the etched portions 120C are comprised of a mesh portion 120A and a grounding frame portion 120B as shown in FIG. 3B. The mesh portion 120A is a electromagnetic wave shielding region.

An example of the masking treatment comprises a series of treatments, that is, the steps of: coating a photosensitive resist, such as casein or PVA, onto a metal foil 120 (S151); drying the coating (S152); then subjecting the coating to contact exposure using a predetermined pattern plate (S153); developing the exposed coating with water (S154); performing hardening treatment and the like; and baking the resist pattern (S155).

The coating of a resist is generally carried out by coating a resist, such as water-soluble casein, PVA, or gelatin, onto both sides or one side (metal foil side) of the laminate member by dipping, curtain coating, or flow coating while carrying the laminate member. In the case of the casein resist, baking at a temperature of about 200 to 300° C. is preferred. In order to prevent the warpage or curling of the laminate member 190, however, if possible, curing is carried out at a lowest possible temperature. When the dry film resist is a photosensitive resist, the working efficiency of the step of resist coating (S151) is good.

According to a preferred embodiment of the present invention, in the etching treatment, a ferric chloride solution is used as the etching solution. In this case, the etching solution can be easily circulated and reutilized, and the etching treatment can be easily carried out in a continuous manner. In this embodiment, the masking treatment (S150) and the etching treatment (S160) are carried out in such a state that the laminate member 190 is stretched without loosening. The masking treatment (S150) and the etching treatment (S160) are carried out in fundamentally the same manner as used in the preparation of a shadow mask for cathode-ray tubes for color TV, from a continuous steel product strip, particularly in the etching treatment from one side of a thin sheet (20 µm to 80 µm). That is, the masking treatment and the etching treatment can be carried out in a continuous through line, and the metal foil in a continuous laminate member strip formed of a laminate of the metal foil and the film can be continuously etched with good productivity.

After the etching treatment (S160), washing treatment and the like are carried out, a pressure-sensitive adhesive layer (corresponding to 135 in FIG. 3) serving also as a flattening layer is provided on the surface of the metal foil in a mesh form, and a silicone separator (a silicone-treated, easily separable PET film) is then laminated (S180). The pressure-sensitive adhesive for the formation of the pressure-sensitive adhesive layer may be the same as the above-described pressure-sensitive adhesive. The provision of the pressure-sensitive adhesive layer may be carried out by roll coating, die coating, blade coating, screen printing or the like. When the electromagnetic wave shielding member is used in an electromagnetic wave shielding plate, the silicone separator is separated from the pressure-sensitive adhesive layer, that is, is a temporary protective film. Thus, an electromagnetic wave shielding member having a layer construction shown in FIG. 3C is prepared.

Next, an NIR layer film 150 is laminated through an adhesive layer (S190), and an AR layer film 160 is then laminated onto the NIR layer film 150 through an adhesive layer (S200). The adhesive for each of the adhesive layers may be the above adhesive. For example, highly transparent acrylic or other adhesives may be used. For example, a pressure-sensitive adhesive (stock No. PSA-4, manufactured by Lintec Corporation) may be mentioned as a commercially available adhesive.

The NIR layer film (150 in FIG. 3D) is a film comprising an NIR layer (a near-infrared absorption layer) provided on a transparent film. No. 2832 manufactured by Toyobo Co., Ltd., comprising an NIR layer coated onto a polyethylene terephthalate (PET) film, is a generally known commercially available NIR layer film.

Near-infrared generally refers to a region of 780 nm to 1000 nm, and the absorption in this wavelength region is preferably not less than 80%. Absorbers (absorbing agents) capable of absorbing specific wavelengths, i.e., the wavelengths of near-infrared include: inorganic infrared absorbers, such as tin oxide, indium oxide, magnesium oxide, titanium oxide, chromium oxide, zirconium oxide, nickel oxide, aluminum oxide, zinc oxide, iron oxide, antimony oxide, lead oxide, and bismuth oxide; and organic infrared absorbers such as cyanine compounds, phthalocyanine compounds, naphthalocyanine compounds, naphthoquinone compounds, anthraquinone compounds, diimoniums, nickel complexes, and dithiol complexes. The inorganic infrared absorber is preferably in the form of fine particles which preferably have an average particle diameter in the range of 0.005 to 1 µm, particularly preferably in the range of 0.01 to 0.5 µm. In order to improve visible light transmittance, preferably, the fine particles of the inorganic infrared absorber have a particle size distribution such that the diameter of the fine particles is not more than 1 µm. Preferably, the infrared absorber is dispersed on a high dispersion level. Metals and pigments, which will be described later, may be mentioned as the absorber (absorbing agent) capable of absorbing visible light.

The absorption layer for visible light region (380 to 780 nm) is provided for obtaining a color balance of displays or for absorbing external light to improve the contrast. The light transmittance of the visible light absorption layer is preferably in the range of 50 to 98%.

Metals as the absorber capable of absorbing wavelengths of visible light include, for example, Nd (neodymium), Au (gold), Pt (platinum), Pd (palladium), Ni (nickel), Cr (chromium), Al (aluminum), Ag (silver), $In_2O_3$—$SnO_2$, CuI, CuS, and Cu (copper). They may be used solely or in a combination of two or more. A visible light absorption layer may be formed, for example, by vapor deposition, CVD, or sputtering. Conventional pigments may be mentioned as the pigment used as the visible light absorber. Specific examples of such pigments include phthalocyanine, azo, condensed azo, azolake, anthraquinone, perylene or perinone, indigo or thioindigo, isoindolino, azomethineazo, dioxyzane, quinacridone, aniline black, triphenylmethane, or other organic pigments, and carbon black, neodymium compound, titanium oxide, iron oxide, iron hydroxide, chromium oxide, spinel-type sinter, chromic acid, chrome vermilion, iron blue, aluminum powder, bronze powder or other pigments.

Although the NIR layer (near-infrared absorption layer) is not particularly limited, the NIR layer preferably has steep absorption in the near-infrared region, has high light transmittance in the visible region, and does not have any large absorption of specific wavelengths, i.e., wavelengths in the visible region.

For example, a layer comprising at least one coloring matter, having a maximum absorption wavelength between light wavelength 800 nm and light wavelength 1000 nm, dissolved in a binder resin may be used as the NIR layer (near-infrared absorption layer), and the thickness of the NIR layer is about 1 to 50 μm.

Examples of the coloring matter include cyanine compounds, phthalocyanine compounds, naphthalocyanine compounds, naphthoquinone compounds, anthraquinone compounds, and dithiol complexes.

Binder resins include polyester resins, polyurethane resins, and acrylic resins. Crosslinked and cured binders using a reaction of epoxy, acrylate, methacrylate, isocyanate group or the like by ultraviolet irradiation or by heating may also be used. Solvents usable for coating include cyclic ethers or ketones capable of dissolving the above coloring matter, for example, tetrahydrofuran, dioxane, cyclohexane, and cyclopentanone.

The AR layer film generally has a layer construction as indicated by 160 in FIG. 3D and is a film comprising an AR layer provided on a transparent film.

The AR layer (antireflection layer) functions to prevent the reflection of visible light. Various AR layers having a single-layer or multilayer structure are known. AR layers having a multilayer structure are generally such that high-refractive index layers and low-refractive index layers are alternately stacked. The material for the antireflection layer is not particularly limited. The antireflection layer may be formed by a dry method, such as sputtering or vapor deposition, or by wet coating. The high-refractive index layer is formed of niobium oxide, titanium oxide, zirconium oxide, ITO or the like. The low-refractive index layer is generally formed of silicon oxide.

The hardcoat 162 in the AR layer film (corresponding to 160 in FIG. 3D) may be formed by heat- or ionizing radiation-curing a polyfunctional acrylate, for example, a polyester acrylate, such as DPHA, TMPTA, or PETA, urethane acrylate, or epoxy acrylate. Here "having hard properties" or "hardcoat" refers to a hardness of H or more as measured by a pencil hardness test specified in JIS K 5400.

The antifouling layer 164 stacked onto the AR layer (163 in FIG. 3D) is a water-repellent, oil-repellent coating, and examples thereof include siloxane anifouling coatings and fluoro antifouling coatings such as fluorinated alkylsilyl compound antifouling coatings.

The AR layer is laminated, and, in such a state that the assembly is stretched without loosening, the assembly is cut (S210) at predetermined positions into each electromagnetic wave shielding member having a layer construction shown in FIG. 3D (S220).

For example, the electromagnetic wave shielding member having a layer construction shown in FIG. 3D thus obtained may be applied to one side of a transparent substrate, such as a glass substrate, followed by the application of an AR layer film (corresponding to 160 in FIG. 3D) to the other side of the transparent substrate to prepare an electromagnetic wave shielding plate. Glass, polyacrylic resin, and polycarbonate resin substrates are suitable as the transparent substrate. If necessary, other plastic films may be used.

Plastic films usable herein include triacetylcellulose films, diacetylcellulose films, acetate butyrate cellulose films, polyether sulfone films, polyacrylic resin films, polyurethane resin films, polyester films, polycarbonate films, polysulfone films, polyether films, trimethylpentene films, polyether ketone films, and (meth)acrylonitrile films. Biaxially stretched polyesters are particularly preferred because of their excellent transparency and durability. In general, the thickness thereof is preferably about 8 to 1000 μm.

For large displays, a 1 to 10 mm-thick rigid substrate is used. On the other hand, for small displays for a character display tube, a 0.01 to 0.5 mm-thick plastic film having suitable flexibility is applied to the display.

The light transmittance of the transparent substrate is ideally 100%. The selection of a transparent substrate having a light transmittance of not less than 80% is preferred.

In a variant of the above embodiment, instead of S180, a flattening resin layer 6 is provided on the metal mesh portion 5 in its concave/convex face. An antireflection layer or an antiglare layer may be stacked onto the flattening resin layer 6, 13 (FIGS. 7 and 8). In another variant of the above embodiment, instead of S180, a flattening resin layer 6 is provided on the metal mesh portion 5 in its concave/convex face, and an adhesive layer containing an absorber (a visible light absorber, near-infrared absorber) is laminated onto the flattening resin layer 6 (FIG. 9). A further variant of the above embodiment is such that, prior to the laminate treatment S130 in this embodiment, blackening treatment is not carried out on at least one side of the metal foil 120, the steps up to the etching treatment (S160) are carried out in the same manner as in this embodiment, the surface portion of the metal foil 120 is then blackened by chromate treatment as blackening treatment, and, thereafter, in the same manner as in this embodiment, the lamination treatment for laminating a silicone separator (a silicone-treated, easily separable PET film) and steps after the lamination treatment are carried out. Further, if necessary, a method may also be adopted wherein, before cutting (S210), the assembly is wound into a roll and the treatment is temporarily stopped. If necessary, the step of slitting the laminate member 190 into a predetermined width may be provided before the masking treatment (S190). In this embodiment, a copper foil is used as the metal foil. An iron material or the like may be used as the metal foil. In still another variant, after the lamination of the NIR layer film (S190), if necessary, a protective film is applied, followed by cutting to prepare an electromagnetic wave shielding member.

Next, a second embodiment of the production process of an electromagnetic wave shielding member according to the present invention will be described with reference to FIG. 1.

The second embodiment is different from the first embodiment in the laminate member formation treatment. In the laminate member formation treatment in the second embodiment, a resin is coated (S135) onto one side of a continuous metal foil strip by a coating method such as extrusion coating or hot melt coating to prepare a laminate member (S140).

As described above, extrusion coating materials include polyolefins and polyesters, and hot melt coating materials include resins composed mainly of ethylene-vinyl acetate resin, resins composed mainly of polyesters, and resins composed mainly of polyamides.

In the second embodiment, since the construction except for the laminate member formation treatment is the same as the construction of the first embodiment, the overlapped explanation will be omitted.

Next, a third embodiment of the production process of an electromagnetic wave shielding member according to the present invention will be described with reference to FIG. 1.

In this embodiment, as with the first embodiment, a member for the production of an electromagnetic wave shielding plate which, in use, is placed in front of a display such as PDP shown in FIG. 5. Specifically, in this embodiment, there is provided a process for mass-producing an electromagnetic wave shielding member having electromagnetic wave shielding properties and see-through properties and comprising a transparent film substrate and a mesh consisting of a thin metal film at least one surface of which has been blackened by chromate treatment, said mesh being laminated on one side of the substrate through an adhesive comprising a styrene-maleic acid copolymer-modified polyesterpolyurethane and an aliphatic polyisocyanate, or an adhesive comprising (a) a polyesterpolyurethanepolyol produced by reacting a polyesterpolyol with a polyisocyanate, (b) a carboxyl-containing polyesterpolyol produced by reacting a polyesterpolyol with an aromatic polycarboxylic anhydride, and (c) a mixture of a trimethylolpropane adduct of isophorone diisocyanate with a trimethylolpropane adduct of xylylene diisocyanate, wherein a 1 to 100 µm-thick copper foil or iron material (low-carbon steel), at least one surface of which has been blackened by chromate treatment, is used as a metal foil for the formation of the mesh consisting of a thin metal film.

In this embodiment, steps up to the lamination treatment (S180) for laminating a silicone separator (a silicone-treated, easily separable PET film) are carried out in the same manner as in the first embodiment. Thereafter, the assembly is cut (S185) into each electromagnetic wave shielding member preparation region in a sheet form. An NIR layer film and an AR layer film each in a sheet form corresponding to the electromagnetic wave shielding member preparation region are successively laminated through an adhesive layer (S195, S205) to prepare an electromagnetic wave shielding member (S220).

Since the material for each portion and the treatment method are the same as those in the first embodiment, the explanation thereof will be omitted. In this embodiment, a method may also be adopted wherein the cut electromagnetic wave shielding member preparation region (S185) having a layer construction corresponding to FIG. 3C as such may be provided as an electromagnetic wave shielding member and this electromagnetic wave shielding member, either alone or in combination with an AR layer film and an NIR layer film, is applied to a transparent substrate, such as a glass substrate, to prepare an electromagnetic wave shielding plate.

The cross section of a characteristic portion in each treatment (cross section at position P1-P2 in FIG. 3B) up to the lamination treatment (S180) in the first and third embodiments will be further briefly described with reference to FIG. 2.

FIGS. 2A to 2G are cross-sectional views taken on position P1–P2 of FIG. 3B. Specifically, FIGS. 2A to 2G show an embodiment wherein an adhesive is used in the laminate treatment (S130) for laminating a PET film or the like. A metal foil 120 (FIG. 2B) is provided on one side of a film substrate 110 (FIG. 2A) through an adhesive layer 130 by the lamination treatment (S130 in FIG. 1). A photosensitive resist is coated onto the metal foil 120, and the coating is dried (FIG. 2C). Thereafter, contact exposure is carried out using a predetermined pattern plate, and the exposed coating is developed and is baked to form a predetermined resist pattern 180 as shown in FIG. 2D.

Next, the metal foil 120 is etched from one side thereof (FIG. 2E) using the resist pattern 180 as an etching-resistant mask. After washing treatment and the like, a pressure-sensitive adhesive layer 135 is provided on the surface of the metal foil 120, and a silicone separator 140 is laminated through the pressure-sensitive adhesive layer 135 (FIG. 2G).

EXAMPLES

The following examples further illustrate the present invention.

Example 1

In the following example, a part of a production process of an electromagnetic wave shielding member as a first example of the embodiment shown in FIG. 1 was carried out.

In the first example of the embodiment shown in FIG. 1, the following adhesive 1 was roll coated on one side of a polyethylene terephthalate (hereinafter referred to also as "PET") film having a thickness of 188 µm and a width of 700 mm as a film substrate (A 4300, manufactured by Toyobo Co., Ltd.), and the coating was dried to form an adhesive layer at a coverage of 4 g/m$^2$.

Adhesive 1:

An ethyl acetate solution (100 parts by weight) of a styrene-maleic acid copolymer-modified polyesterpolyurethane (solid content (hereinafter referred to also as "NV") 50%, manufactured by ROCK PAINT CO., LTD.) was mixed with 10 parts by weight of an ethyl acetate solution of an aliphatic polyisocyanate (NV 75%, manufactured by ROCK PAINT CO., LTD.) to prepare a mixed solution. This mixed solution (100 parts by weight) was mixed with 45 parts by weight of ethyl acetate to prepare an adhesive 1.

Figure 12:
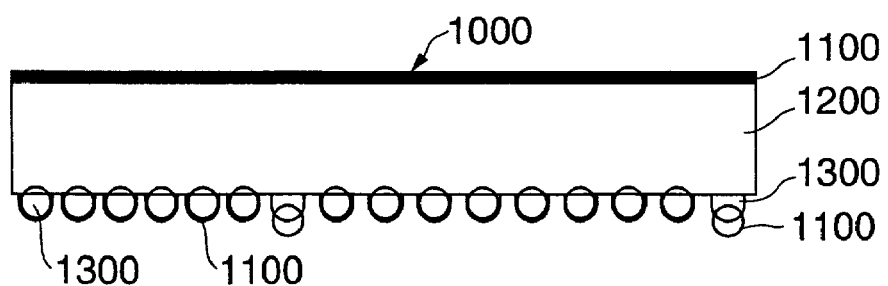
FIG. 12 is a typical cross-sectional view showing the state of a copper foil 1000, before etching, with copper bosses 1300 deposited thereon, constituting the electromagnetic wave shielding member 4000 shown in FIG. 11.

A copper foil (EXP-WS, width 700 mm, thickness 9 µm, manufactured by Furukawa Circuit Foil Co., Ltd.), wherein both sides of a copper layer 1200 with copper bosses 1300 deposited on its one side had been blackened by chromate treatment, as shown in FIG. 12 was provided as a metal foil.

The copper foil 1200 and the PET film were laminated on top of each other by means of a laminator comprising a metallic roll and a rubber roll so that the chromate layer 1100 (blackening layer) of the copper foil 1200 on its side, where the copper bosses 1300 had been deposited, faced the adhesive layer side of the PET film, with caution so as not to cause cockling or to form air bubbles. Thus, a laminate member 190 (sheet) having a total thickness of 200 µm was prepared.

A process from masking to etching was then performed by a continuous through line, that is, a shadow mask line (hereinafter referred to also as "SM line"). In this SM line, a shadow mask for a cathode-ray tube for color TV is prepared from a strip-shaped continuous steel product (thin plate; 20 µm to 80 µm) by a process for masking and etching from one side of the steel product in such a state that the steel product is stretched.

Casein was provided as a photosensitive resist and was flow coated so as to cover the whole one side (metal foil side) of the laminate member 190 while carrying the laminate member 190.

A pattern plate for forming a mesh portion 120A and a grounding frame portion 120B as shown in FIG. 3B was provided which had a mesh angle of 30 degrees, a mesh line width of 20 μm, and a mesh pitch (corresponding to Px and Py in FIG. 4) of 200 μm. This was used to carry out contact exposure with a printing frame in the SM line (S153), and the exposed coating was then developed with water (S154), was subjected to hardening treatment and the like, and was further baked at 100° C. (S155).

Next, in such a state that the laminate member 190 was stretched, a ferric chloride solution of 42 Baume degrees at 50° C. as an etching solution was sprayed on the metal foil using the resist pattern as an etching-resistant mask to etch the exposed region, whereby a mesh portion and a grounding frame portion were formed.

Next, in the SM line, in such a state that the laminate member 190 was stretched, the laminate member 190 was washed with water, the resist was separated with an alkaline solution, and, further, washing, drying and the like were carried out. Thus, a test film 1 was prepared.

Comparative Example 1

A test film 2 was prepared in the same manner as in Example 1, except that the adhesive 1 was changed to the following adhesive 2.

Adhesive 2:

An ethyl acetate solution (100 parts by weight) of a styrene-maleic acid copolymer-modified polyesterpolyurethane (solid content (NV) 50%, manufactured by ROCK PAINT CO., LTD.) was mixed with 10 parts by weight of an ethyl acetate solution of an aromatic polyisocyanate (solid content (NV) 75%, manufactured by ROCK PAINT CO., LTD.) to prepare a mixed solution. This mixed solution (100 parts by weight) was mixed with 45 parts by weight of ethyl acetate to prepare an adhesive 2.

Comparative Example 2

A test film 3 was prepared in the same manner as in Example 1, except that the adhesive 1 was changed to the following adhesive 3.

Adhesive 3:

An ethyl acetate solution (100 parts by weight) of polyesterpolyurethane (solid content (NV) 50%, manufactured by Takeda Chemical Industries, Ltd.) was mixed with 10 parts by weight of an ethyl acetate solution of an aliphatic polyisocyanate (solid content (NV) 75%, manufactured by Takeda Chemical Industries, Ltd.) to prepare a mixed solution. This mixed solution (100 parts by weight) was mixed with 45 parts by weight of ethyl acetate to prepare an adhesive 3.

Example 2

In the following example, a part of a production process of an electromagnetic wave shielding member as a first example of the embodiment shown in FIG. 1 was carried out.

In the first example of the embodiment shown in FIG. 1, the following adhesive 4 was roll coated on one side of a polyethylene terephthalate (hereinafter referred to also as "PET") film having a thickness of 0.1 mm and a width of 700 mm as a film substrate (A 4300, manufactured by Toyobo Co., Ltd.), and the coating was dried to form an adhesive layer at a coverage of 4 g/m².

Adhesive 4:

An ethyl acetate solution (100 parts by weight) of a resin produced by mixing (a) a polyesterpolyurethanepolyol, produced by reacting isophorone diisocyanate with a mixture of a polyesterpolyol, produced by esterifying isophthalic acid with ethylene glycol and neopentyl glycol, with a polyesterpolyol produced by esterifying isophthalic acid with diethylene glycol, with (b) a carboxyl-containing polyesterpolyol produced by reacting a polyesterpolyol, produced by esterifying isophthalic acid with ethylene glycol, neopentyl glycol, and 2,5-hexanediol, with trimellitic anhydride (this ethyl acetate solution of the resin being manufactured by Takeda Chemical Industries, Ltd.; NV 50%) was mixed with (c) 10 parts by weight of an ethyl acetate solution of a mixture of a trimethylolpropane adduct of isophorone diisocyanate with a trimethylolpropane adduct of xylylene diisocyanate (this ethyl acetate solution of the mixture being manufactured by Takeda Chemical Industries, Ltd.; NV 75%).

This mixed solution (100 parts by weight) was mixed with 45 parts by weight of ethyl acetate to prepare an adhesive 4.

A copper foil (electrolytic copper foil manufactured by Furukawa Circuit Foil Co., Ltd.; B-WS, width 700 mm, thickness 0.01 mm,), wherein both sides of a copper layer 1200 with copper bosses 1300 deposited on its one side had been blackened by chromate treatment, as shown in FIG. 12 was provided as a metal foil.

The copper foil 1200 and the PET film were laminated on top of each other by means of a laminator comprising a metallic roll and a rubber roll so that the chromate layer 1100 (blackening layer) of the copper foil 1200 on its side, where the copper bosses 1300 had been deposited, faced the adhesive layer side of the PET film, with caution so as not to cause cockling or to form air bubbles. Thus, a laminate member 190 (sheet) having a total thickness of 200 μm was prepared.

A process from masking to etching was then performed by a continuous through line, that is, a shadow mask line (hereinafter referred to also as "SM line"). In this SM line, a shadow mask for a cathode-ray tube for color TV is prepared from a strip-shaped continuous steel product (thin plate; 20 μm to 80 μm) by a process for masking and etching from one side of the steel product in such a state that the steel product is stretched.

Casein was provided as a photosensitive resist and was flow coated so as to cover the whole one side (metal foil side) of the laminate member 190 while carrying the laminate member 190.

A pattern plate for forming a mesh portion 120A and a grounding frame portion 120B as shown in FIG. 3B was provided which had a mesh angle of 30 degrees, a mesh line width of 20 μm, and a mesh pitch (corresponding to Px and Py in FIG. 4) of 200 μm. This was used to carry out contact exposure with a printing frame in the SM line (S153), and the exposed coating was then developed with water (S154), was subjected to hardening treatment and the like, and was further baked at 100° C. (S155).

Next, in such a state that the laminate member 190 was stretched, a ferric chloride solution of 42 Baume degrees at 50° C. as an etching solution was sprayed on the metal foil using the resist pattern as an etching-resistant mask to etch the exposed region, whereby a mesh portion and a grounding frame portion were formed.

Next, in the SM line, in such a state that the laminate member 190 was stretched, the laminate member 190 was washed with water, the resist was separated with an alkaline solution, and, further, washing, drying and the like were carried out. Thus, a test film 4 was prepared.

Comparative Example 3

A test film 5 was prepared in the same manner as in Example 2, except that the adhesive 4 was changed to the following adhesive 5.

Adhesive 5:

An ethyl acetate solution (100 parts by weight) of a resin produced by mixing (a) a polyesterpolyurethanepolyol, produced by reacting isophorone diisocyanate with a mixture of a polyesterpolyol, produced by esterifying isophthalic acid with ethylene glycol and neopentyl glycol, with a polyesterpolyol produced by esterifying isophthalic acid with diethylene glycol, with (b) a carboxyl-containing polyesterpolyol produced by reacting a polyesterpolyol, produced by esterifying isophthalic acid with ethylene glycol, neopentyl glycol, and 2,5-hexanediol, with trimellitic anhydride (this ethyl acetate solution of the resin being manufactured by Takeda Chemical Industries, Ltd.; NV 50%) was mixed with (c) 10 parts by weight of an ethyl acetate solution of a trimethylolpropane adduct of tolylene diisocyanate (this ethyl acetate solution of the adduct being manufactured by Takeda Chemical Industries, Ltd.; NV 75%).

This mixed solution (100 parts by weight) was mixed with 45 parts by weight of ethyl acetate to prepare an adhesive 5.

Comparative Example 4

A test film 6 was prepared in the same manner as in Example 2, except that the adhesive 4 was changed to the following adhesive 6.

Adhesive 6:

(a) A polyesterpolyurethanepolyol (100 parts by weight) produced by reacting tolylene diisocyanate with a polyesterpolyol produced by esterifying isophthalic acid with ethylene glycol and neopentyl glycol (this polyesterpolyurethanepolyol being manufactured by Takeda Chemical Industries, Ltd.; NV 50%) was mixed with (c) 10 parts by weight of an ethyl acetate solution of a trimethylolpropane adduct of xylylene diisocyanate (this ethyl acetate solution of the adduct being manufactured by Takeda Chemical Industries, Ltd.; NV 75%).

This mixed solution (100 parts by weight) was mixed with 45 parts by weight of ethyl acetate to prepare an adhesive 6.

The results of the measurement of optical characteristics of test films 1 to 3 are shown in Table 1. Here $\Delta AB^*$ is represented by equation (1):

$$\Delta AB^* = (\Delta a^* \times \Delta a^* + \Delta b^* \times \Delta b^*)^{1/2} \quad (1)$$

TABLE 1

| Sample No. | $\Delta a^*$ | $\Delta b^*$ | $\Delta a^*$ ratio | $\Delta b^*$ ratio | $\Delta AB^*$ | Tt % |
|---|---|---|---|---|---|---|
| Test film 1 (Ex. 1) | −0.559 | 3.385 | 0.334868 | 0.598519 | 3.431029 | 88.7 |
| Test film 2 (Comp. Ex. 1) | −0.878 | 5.579 | 0.526202 | 0.986451 | 5.648039 | 88.1 |
| Test film 3 (Comp. Ex. 2) | −1.669 | 5.656 | 1 | 1 | 5.897015 | 87.3 |
| Test film 4 (Ex. 2) | −0.651 | 3.792 | 0.3333 | 0.5874 | 3.8475 | 85.3 |
| Test film 5 (Comp. Ex. 3) | −0.969 | 6.215 | 0.4962 | 0.9627 | 6.2901 | 85.1 |
| Test film 6 (Comp. Ex. 4) | −1.953 | 6.456 | 1 | 1 | 6.7449 | 87.3 |

Here $\Delta a^*$, $\Delta b^*$, $\Delta a^*$ ratio, $\Delta b^*$ ratio, $\Delta AB^*$, Tt [%] have the following respective meanings.
$\Delta a^*$: Transmission chromaticity difference of $L^*a^*b^*$ color system
$\Delta b^*$: Transmission chromaticity difference of $L^*a^*b^*$ color system
$\Delta a^*$ ratio: $\Delta a^*$ ratio of each sample based on $\Delta a^*$ of test films 3 and 6
$\Delta b^*$ ratio: $\Delta b^*$ ratio of each sample based on $\Delta b^*$ of test films 3 and 6
$\Delta AB^*$: Chromaticity difference obtained by combining chromaticity differences of $\Delta a^*$ and $\Delta b^*$
Tt [%]: Total light transmittance Measuring methods for each numerical value shown in Table 1 and acceptable value range for properties (excellent etching resistance, excellent optical characteristics, and color change) will be described.

Etching resistance: Pattern remaining after etching is not separated.

Optical characteristics: Conceptually, the light transmittance is high, and the film is colorless.

In Table 1, since Tt (total light transmittance) is substantially identical for test films 1 to 6, a $\Delta AB^*$ value of not more than 4 and not less than 0 (zero) is regarded as acceptable.

From the results shown in Table 1 and the like, it is apparent that electromagnetic wave shielding members bonded with an adhesive comprising a mixture of a styrene-maleic acid copolymer-modified polyesterpolyurethane with an organic polyisocyanate, or an adhesive comprising a mixture of (a) a polyesterpolyurethanepolyol produced by reacting a polyesterpolyol with a polyisocyanate with (b) a carboxyl-containing polyesterpolyol produced by reacting a polyesterpolyol with an aromatic polycarboxylic anhydride and (c) a mixture of a trimethylolpropane adduct of isophorone diisocyanate with a trimethylolpropane adduct of xylylene diisocyanate are excellent in etching resistance, as well as in optical characteristics. In particular, the electromagnetic wave shielding member bonded with the adhesive comprising an aliphatic isocyanate prepared in Example 1 and the electromagnetic wave shielding member bonded with the adhesive comprising a mixture of a trimethylolpropane adduct of isophorone diisocyanate with a trimethylolpropane adduct of xylylene diisocyanate prepared in Example 2 are free from a change in color of the adhesive upon etching and are excellent in etching resistance, as well as in optical characteristics.

Example 3

The test films 1 and 4 were subjected to the following flattening treatment.

Flattening Treatment:

A urethane ultraviolet-curable resin having a viscosity of 1500 mPa·s was provided and was coated by screen printing to a thickness of 40 μm on only the concave-convex face of a metal foil (a mesh portion) so as not to cover the ground electrode portion around the test film 1.

Further, a 38 μm-thick untreated PET film having high surface smoothness was laminated as a peel film by means of a laminator onto the screen printed face.

Thereafter, the print was cured with ultraviolet light at a dose of 200 mJ/cm², and the 38 μm-thick untreated PET film having high surface smoothness was separated to produce a flattened metallic mesh sheet.

| Color adhesive layer: Color adhesive material: | |
|---|---|
| Nickel complex compound (near-infrared absorber) | 2 pts. wt. |
| Neodymium oxide (visible light absorber) | 2 pts. wt. |
| Polyester resin | 550 pts. wt. |
| Methyl ethyl ketone | 920 pts. wt. |
| Toluene | 920 pts. wt. |

The color adhesive material was dispersed and mixed by means of a triple roll to prepare a color adhesive. Next, the color adhesive was coated by means of a 100 μm applicator onto the surface of the flattened layer in the flattened metallic mesh sheet. The coating was then dried at about 90° C. to remove the solvent. Thus, an electromagnetic wave shielding member was prepared which had a layer construction such that a 10 μm-thick color adhesive layer was formed. A glass plate was stacked onto the electromagnetic wave shielding member in its color adhesive layer side.

Measurement of Spectral Transmittance and Reflectance:

The reflectance and transmittance of visible light at wavelengths of 380 to 780 nm were measured with a spectrometer UV-3100 PC manufactured by Shimadzu Seisakusho Ltd., and the transmittance of near-infrared at a wavelength of 1000 nm was measured with an integrating sphere.

Results of Measurement of Spectral Transmittance and Reflectance:

| (i) For visible light at wavelengths of 380 to 780 nm, | |
|---|---|
| transmittance (T %) | 62% |
| reflectance (R %) | 15% |
| R/T | 0.24 |
| (ii) For near-infrared at a wavelength of 1000 nm, | |
| transmittance (T %) | 11% |

Comparative Example 5

The procedure of Example 3 was repeated, except that the ingredients of the color adhesive material were changed as follows.

| Color adhesive material: | |
|---|---|
| Polyester resin | 550 pts. wt. |
| Methyl ethyl ketone | 920 pts. wt. |
| Toluene | 920 pts. wt. |

The spectral transmittance and reflectance of the electromagnetic wave shielding member thus obtained were measured. The results are shown below.

Results of Measurement of Spectral Transmittance and Reflectance:

| (i) For visible light at wavelengths of 380 to 780 nm, | |
|---|---|
| transmittance (T %) | 77% |
| reflectance (R %) | 38% |
| R/T | 0.49 |
| (ii) For near-infrared at a wavelength of 1000 nm, | |
| transmittance (T %) | 92% |

What is claimed is:

1. An electromagnetic wave shielding member comprising:
    a transparent film substrate; and
    a thin metal film mesh provided on a surface of the substrate through an adhesive,
    said adhesive comprising a styrene-maleic acid copolymer-modified polyesterpolyurethane and an aliphatic polyisocyanate.

2. The electromagnetic wave shielding member according to claim 1, wherein the film substrate is polyethylene terephthalate and the thin metal film mesh has a thickness of 5 to 20 μm.

3. The electromagnetic wave shielding member according to claim 1, wherein the thin metal film mesh is a copper foil and the thin metal film mesh has been roughened by cathodically electrodepositing copper bosses on at least one side of the copper foil, and at least one side of the copper foil has been chromated.

4. The electromagnetic wave shielding member according to claim 3, wherein the surface, on which the copper bosses have been cathodically electrodeposited, has been bonded to the film substrate.

5. A process for producing the electromagnetic wave shielding member of claim 1, comprising the steps of:
    laminating a thin metal film on the surface of the transparent film substrate with the aid of the adhesive; and
    etching the laminated thin metal film to form the mesh,
    said adhesive comprising a styrene-maleic acid
    said adhesive comprising a styrene-maleic acid copolymer-modified polyesterpolyurethane and an aliphatic polyisocyanate.

6. The process according to claim 5, wherein ferric chloride is used in the etching treatment.

7. An electromagnetic wave shielding member comprising:
    a transparent film substrate; and
    a thin metal film mesh provided on a surface of the substrate through an adhesive,
    said adhesive comprising:
    (a) a polyesterpolyurethanepolyol produced by reacting a polyesterpolyol with a polyisocyanate,
    (b) a carboxyl-containing polyesterpolyol produced by reacting a polyesterpolyol with an aromatic polycarboxylic anhydride, and
    (c) a mixture of a trimethylolpropane adduct of isophorone diisocyanate with a trimethylolpropane adduct of xylylene diisocyanate.

8. The electromagnetic wave shielding member according to claim 7, wherein said polyesterpolyol comprises:
    (a) an ester of isophthalic acid with ethylene glycol and neopentyl glycol,
    (b) an ester of isophthalic acid with diethylene glycol, (c) an ester of isophthalic acid with ethylene glycol, neopentyl glycol, and 2,5-hexanediol, or (d) a mixture of said esters (a) to (c).

9. The electromagnetic wave shielding member according to claim 7, wherein the film substrate is polyethylene terephthalate and the thin metal film mesh has a thickness of 5 to 20 μm.

10. The electromagnetic wave shielding member according to claim 7, wherein the thin metal film mesh is a copper foil and the thin metal film mesh has been roughened by cathodically electrodepositing copper bosses on at least one side of the copper foil, and at least one side of the copper foil has been chromated.

11. A process for producing the electromagnetic wave shielding member of claim 7, comprising the steps of:
   laminating a thin metal film on the surface of the transparent film substrate with the aid of the adhesive; and
   etching the laminated thin metal film to form the mesh,
   said adhesive comprising:
   (a) a polyesterpolyurethanepolyol produced by reacting a polyesterpolyol with a polyisocyanate,
   (b) a carboxyl-containing polyesterpolyol produced by reacting a polyesterpolyol with an aromatic polycarboxylic anhydride, and
   (c) a mixture of a trimethylolpropane adduct of isophorone diisocyanate with a trimethylolpropane adduct of xylylene diisocyanate.

12. The process according to claim 11, wherein ferric chloride is used in the etching treatment.

13. An electromagnetic wave shielding member comprising:
   a transparent film substrate; and
   a thin metal film mesh provided on a surface of the substrate through an adhesive,
   said adhesive comprising a styrene-maleic acid copolymer-modified polyesterpolyurethane and an aliphatic polyisocyanate,
   said adhesive containing an absorber which can absorb specific wavelengths, in at least one of the visible light wavelength region and the near-infrared wavelength region.

14. The electromagnetic wave shielding member according to claim 13, wherein flattening a layer for flattening a concave-convex surface of the mesh is further provided on the thin metal film mesh.

15. The electromagnetic wave shielding member according to claim 14, wherein the flattening layer is provided on the thin metal film mesh through a pressure-sensitive adhesive, and
   at least one of the flattening layer and the pressure-sensitive adhesive also contains an absorber which can absorb specific wavelengths in at least one of the visible light wavelength region and the near-infrared wavelength region.

16. The electromagnetic wave shielding member according to claim 14, wherein the flattening layer also contains an absorber which can absorb specific wavelengths in at least one of the visible light wavelength region and the near-infrared wavelength region.

17. An electromagnetic wave shielding member comprising:
   a transparent film substrate; and
   a thin metal film mesh provided on a surface of the substrate through an adhesive,
   said adhesive comprising
   (a) a polyesterpolyurethanepolyol produced by reacting a polyesterpolyol with a polyisocyanate,
   (b) a carboxyl-containing polyesterpolyol produced by reacting a polyesterpolyol with an aromatic polycarboxylic anhydride, and
   (c) a mixture of a trimethylolpropane adduct of isophorone diisocyanate with a trimethylolpropane adduct of xylylene diisocyanate,
   said adhesive containing an absorber which can absorb specific wavelengths, in at least one of the visible light wavelength region and the near-infrared wavelength region.

18. The electromagnetic wave shielding member according to claim 17, wherein a flattening layer for flattening a concave-convex surface of the mesh is further provided on the thin metal film mesh.

19. The electromagnetic wave shielding member according to claim 18, wherein the flattening layer is provided on the thin metal film mesh through a pressure-sensitive adhesive, and
   at least one of the flattening layer and the pressure-sensitive adhesive also contains an absorber which can absorb specific wavelengths in at least one of the visible light wavelength region and the near-infrared wavelength region.

20. The electromagnetic wave shielding member according to claim 18, wherein the flattening layer also contains an absorber which can absorb specific wavelengths in at least one of the visible light wavelength region and the near-infrared wavelength region.

* * * * *